United States Patent
Acosta et al.

(10) Patent No.: US 11,313,817 B2
(45) Date of Patent: Apr. 26, 2022

(54) OPTICAL NUCLEAR MAGNETIC RESONANCE MICROSCOPE AND MEASUREMENT METHODS

(71) Applicants: UNM Rainforest Innovations, Albuquerque, NM (US); Victor Marcel Acosta, Albuquerque, NM (US); Andrejs Jarmola, Albany, CA (US)

(72) Inventors: Victor Marcel Acosta, Albuquerque, NM (US); Andrejs Jarmola, Albany, CA (US)

(73) Assignee: UNM Rainforest Innovations, Albuquerque, NM (US)

( * ) Notice: Subject to any disclaimer, the term of this patent is extended or adjusted under 35 U.S.C. 154(b) by 0 days.

(21) Appl. No.: 17/271,445

(22) PCT Filed: Aug. 27, 2019

(86) PCT No.: PCT/US2019/048429
§ 371 (c)(1),
(2) Date: Feb. 25, 2021

(87) PCT Pub. No.: WO2020/047006
PCT Pub. Date: Mar. 5, 2020

(65) Prior Publication Data
US 2021/0255126 A1    Aug. 19, 2021

Related U.S. Application Data

(60) Provisional application No. 62/723,074, filed on Aug. 27, 2018.

(51) Int. Cl.
*G01N 24/08*  (2006.01)
*G01R 33/28*  (2006.01)
(Continued)

(52) U.S. Cl.
CPC .......... *G01N 24/08* (2013.01); *G01R 33/282* (2013.01); *G01R 33/302* (2013.01);
(Continued)

(58) Field of Classification Search
CPC .... G01N 24/08; G01R 33/282; G01R 33/302; G01R 33/323; G01R 33/465; B82Y 35/00
See application file for complete search history.

(56) References Cited

U.S. PATENT DOCUMENTS 6,683,451 B1    1/2004  Moore et al.
7,743,648 B1    6/2010  Berman et al.
(Continued)

FOREIGN PATENT DOCUMENTS

WO    WO-2020047006 A1    3/2020

OTHER PUBLICATIONS

"International Application Serial No. PCT/US2019/048429, International Search Report dated Nov. 28, 2019", 2 pgs.
(Continued)

*Primary Examiner* — Jay Patidar
(74) *Attorney, Agent, or Firm* — Schwegman Lundberg & Woessner, P.A.

(57) ABSTRACT

A variety of application can use nuclear magnetic resonance as an investigative tool. Nuclear magnetic resonance measurements can be conducted using a nuclear magnetic resonance microscope. An example nuclear magnetic resonance microscope can comprise a film embedded in a coverslip, where the film is doped with reactive centers that undergo stable fluorescence when illuminated by electromagnetic radiation having a wavelength within a range of wavelengths and a magnetic field generator to provide a magnetic field for nuclear magnetic resonance measurement of analytes when disposed proximal to the film. Microwave striplines on the coverslip can be arranged to generate microwave fields to
(Continued)

irradiate the analytes for the nuclear magnetic resonance measurement. Control of the microwave signals on the microwave striplines can be used for dynamic nuclear polarization in the nuclear magnetic resonance measurement of analytes.

34 Claims, 18 Drawing Sheets

(51) Int. Cl.
  *G01R 33/30* (2006.01)
  *G01R 33/32* (2006.01)
  *G01R 33/465* (2006.01)
  *B82Y 35/00* (2011.01)
(52) U.S. Cl.
  CPC ......... *G01R 33/323* (2013.01); *G01R 33/465* (2013.01); *B82Y 35/00* (2013.01)

(56) References Cited

U.S. PATENT DOCUMENTS

| | | |
|---|---|---|
| 2004/0232914 A1 | 11/2004 | Barbic |
| 2008/0173812 A1 | 7/2008 | Berman et al. |
| 2015/0238125 A1* | 8/2015 | Acosta ................ A61B 5/1455 600/310 |
| 2019/0277842 A1* | 9/2019 | Cleveland ........ G01N 33/54386 |

OTHER PUBLICATIONS

"International Application Serial No. PCT/US2019/048429, Written Opinion dated Nov. 28, 2019", 3 pgs.

\* cited by examiner

OPTICAL NUCLEAR MAGNETIC RESONANCE MICROSCOPE AND MEASUREMENT METHODS

CLAIM OF PRIORITY

This application is a U.S. National Stage Filing under 35 U.S.C. 371 from International Application No. PCT/US2019/048429, filed 27 Aug. 2019, and published as WO 2020/047006 on 5 Mar. 2020, which application claims the priority benefit of U.S. Provisional Application Ser. No. 62/723,074, filed 27 Aug. 2018, entitled "OPTICAL NUCLEAR MAGNETIC RESONANCE MICROSCOPE AND MEASUREMENT METHODS," which applications are incorporated herein by reference in their entirety.

BACKGROUND

Nuclear magnetic resonance (NMR) is amongst the most powerful analytical techniques ever invented. This has been recognized by, for example, the six Nobel Prizes awarded for NMR methods development. Beyond methods, NMR has been applied to validate some of the greatest scientific discoveries of the last few decades. In synthetic chemistry, NMR has played a critical role in several Nobel-Prize-winning discoveries, including the 2005 Chemistry prize for the role of catalysts in reactions and the 1996 Prize for the discovery of fullerenes. In clinical medicine, MRI (the imaging version of NMR) is found in most major hospitals. It is used for a variety of diagnostic purposes including locating tumors and diagnosing heart disease. More recently, functional MRI of the brain has been used to understand cognition. In the metabolomics fields, NMR has played an important role in unravelling protein structure, particularly when x-ray crystallography is not possible. NMR also plays an essential role augmenting mass spectrometry in the field of metabolomics, where the goal is to determine the presence and abundance of small molecules in bodily fluids.

Despite its impressive record in spectroscopic analysis, NMR is notoriously plagued by poor sensitivity. State-of-the-art NMR spectrometers typically feature detection thresholds of approximately $10^{14}$ spins. This places NMR sensitivity many orders of magnitude behind other analytical chemistry techniques such as mass spectrometry, Raman spectroscopy, and optical absorption. One of the challenges is that the NMR sensitivity is proportional to approximately the square of the strength of the magnet used. This has motivated the use of larger and larger magnets, and the most powerful magnets these days take up an entire warehouse. Nonetheless, the NMR sensitivity has largely plateaued; over the last twenty-five years, the fundamental signal strength has only increased by a factor of two or so.

At the same time, there is an acute need for non-invasive, label-free, chemically-specific techniques that operate at the single-cell or sub-cellular level. While there have emerged a number of impressive ways to determine the potential and purpose of individual cells, it remains difficult to non-destructively monitor, in real time, their evolving energetic state and molecular composition. This is particularly important for understanding the role of metabolites on these size scales. Metabolites are small molecules that report on the energetic state of cells, but, being small and coming in many different molecular forms, they are notoriously difficult to quantify without perturbing their function. Techniques such as mass spectrometry, Raman spectroscopy, and fluorescence nanosensors are currently being explored for these purposes. NMR would be a valuable addition, owing to its rich, non-invasive, chemically specific spectroscopic information.

SUMMARY

An optical nuclear magnetic resonance microscope and measurement methods are disclosed. Example NMR microscopes, among other components, may include a magneto-fluorescent diamond film, embedded in a coverslip, to generate and detect nuclear magnetization with high sensitivity and spatial resolution using diamond quantum sensing techniques.

BRIEF DESCRIPTION OF THE DRAWINGS

Various features and attendant advantages of the disclosed technologies will become fully appreciated when considered in conjunction with the accompanying drawings in which.

DETAILED DESCRIPTION

The following detailed description refers to the accompanying drawings that show, by way of illustration and not limitation, various embodiments that may be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The phraseology and terminology employed herein are for the purpose of the description and should not be regarded as limiting. The following detailed description is, therefore, not to be taken in a limiting sense.

In various embodiments, NMR microscopes may include a magneto-fluorescent diamond film, embedded in a coverslip, to generate and detect nuclear magnetization with high sensitivity and spatial resolution using diamond quantum sensing techniques. A coverslip can used to cover and protect a specimen on a microscope slide and is typically a small, thin piece of glass. The disclosed NMR microscope may be used, for example, to examine cell cultures. The cells may optionally be stained with fluorescent tags to visualize cell properties. A microscope operator can flip a switch, and record a new type of image stack, where every pixel registers the NMR spectrum of an adjacent part of the sample. Operation of such a switch can be automated using a processor executing instructions to control the microscope, including recording measurements. The spectra may contain non-invasive, label-free, chemically-specific information about the sample's molecular composition. The disclosed NMR microscope can have high sensitivity and spatial resolution, enabling optical recording of NMR spectra with diffraction-limited resolution (less than 1 μm), over a typical microscope's field of view (approximately 100 μm), at biologically-relevant concentrations (less than 10 mM) and timescales (approximately 1 s). Further aspects of the disclosed optical NMR microscope and measurement techniques are provided below.

Figure 1B:
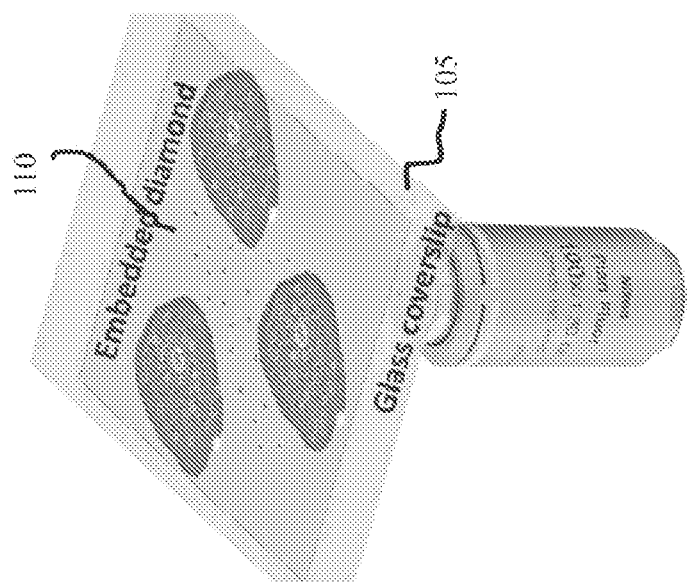
FIG. 1B illustrates an example of magneto-fluorescent diamond coverslip for NMR imaging in order to reveal the details of FIG. 1A in a single cell NMR microscope, in accordance with various embodiments.
Figure 1A:
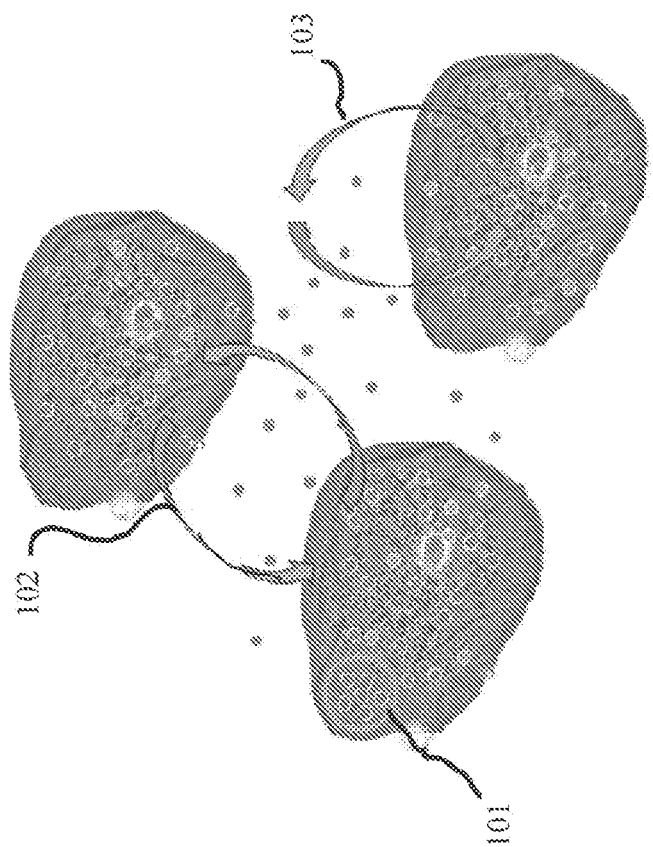
FIG. 1A illustrates an example of details of sub-cellular metabolic composition, cell heterogeneity, and inter-cellular transport, in accordance with various embodiments.

An ideal NMR microscope would monitor the heterogeneity of molecular content at the single cell level, determine which compartments within a cell exhibit the highest metabolic activity for various processes, and even record videos which show how metabolites are transported between cells in a culture. FIG. 1A illustrates an example of details of sub-cellular metabolic composition, cell heterogeneity, and inter-cellular transport. Such details include localized region of metabolic activity 101, metabolic exchange between cells in a culture 102, and monitor exchange of compounds between cell/environment 103. FIG. 1B illustrates an example of magneto-fluorescent diamond coverslip 105, having embedded diamond 110, for NMR imaging in order to reveal the details of FIG. 1A. The diamond can be embedded in a glass coverslip. Such a magneto-fluorescent diamond coverslip for NMR imaging can be used in a single cell NMR microscope.

Figure 3A:
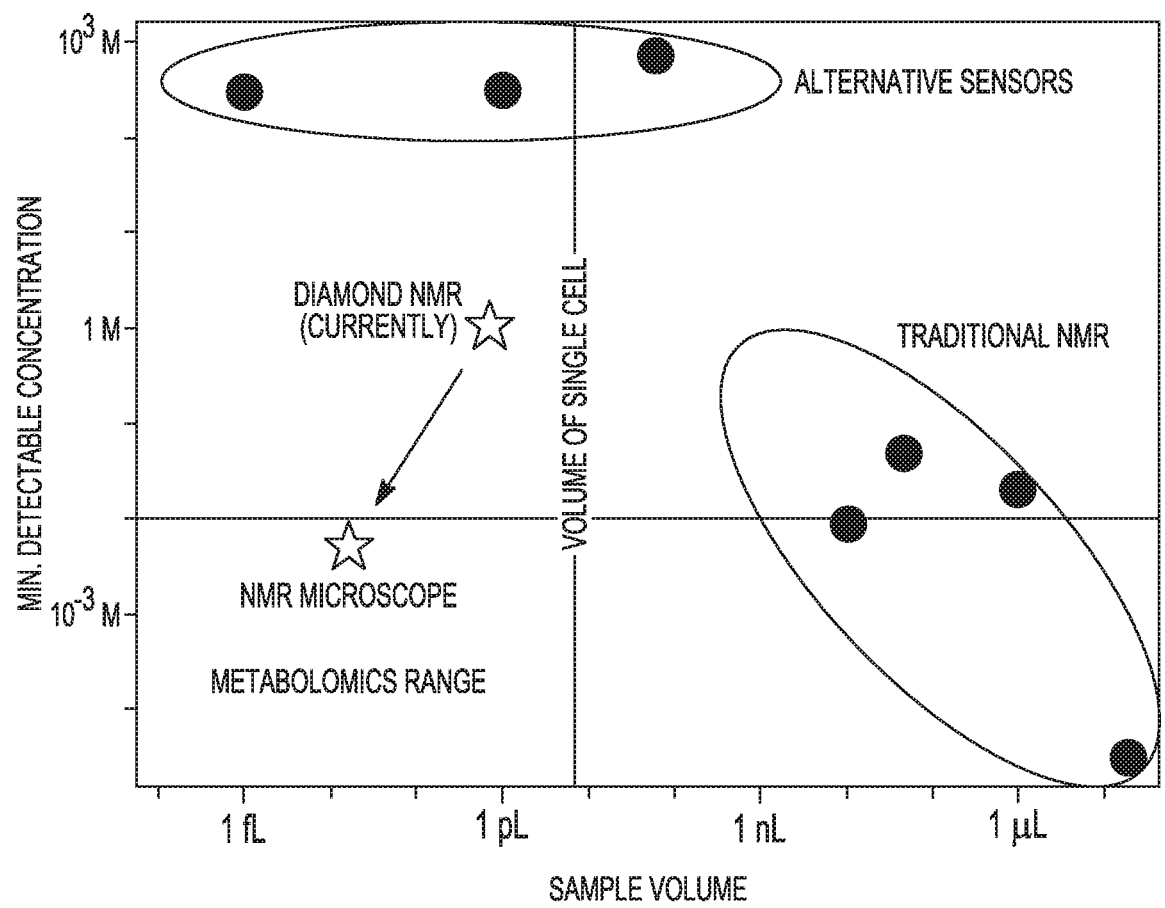
FIG. 3A summarizes existing NMR techniques for small sample volumes.

To be relevant for single-cell metabolomics, a technique should detect volumes around the size of a single mammalian cell (~10 pL) at biologically-relevant metabolite concentrations (<10 mM). FIG. 3A plots the present landscape of NMR techniques. Traditional coil-based NMR systems feature fairly high sensitivity but falls orders of magnitude short in detection volume. To push detection volumes below the single cell level, alternative NMR sensors have been developed in the last ~10 years. They are able to reach single cell detection volumes, but suffer from fairly poor sensitivity in the 100s of molar range.

In various embodiments, magneto-fluorescent diamond films can be used to polarize and detect nuclear magnetization. Use of such films can fundamentally change NMR hardware. This technique can work with picoliters (pL) of analyte at ambient temperature and can allow for the use of small magnetic fields generated by permanent magnets.

Below is described a platform for this approach and its potential application to the study of single-cell metabolomics. Additionally, this technology may be uniquely suited to address the problem of affordability in NMR systems. A modern NMR spectrometer can cost millions of dollars, and even the cheapest benchtop versions cost $50-100 k. This is too expensive for many small colleges, startups, and much of the developing world. A large share of the manufacturing costs goes into engineering large magnet systems needed to address the relatively large sample volumes (μL). With the small volumes (pL) used in the technology disclosed herein, the engineering costs are expected to be significantly lower.

FIG. 1B illustrates an embodiment of an example diamond NMR microscope, depicted at least in part, that employs a diamond doped with a dense layer of fluorescent sensors at its surface. For example, glass coverslip 105 can have embedded diamond. The sensors can be nitrogen vacancy (NV) color centers, which exhibit far-red (650-800 nm), photostable fluorescence. When interrogated by microwaves, the fluorescence intensity from the NV centers becomes magnetically sensitive, which can be used to provide spatially-resolved maps of local magnetic fields. Specifically, the NV centers exhibit high-contrast optically-detected magnetic resonances (ODMRs). The NV center has a spin-triplet ground state. Laser illumination at 500-650 nm produces a high degree of spin polarization in the $m_s=0$ level, which fluoresces brightly. If microwaves resonant with a ground-state spin transition are applied, some of the NV population is transferred to the $m_s=\pm1$ levels. The level dynamics of the center are such that NV centers in the $m_s=\pm1$ levels fluoresce less brightly than those in the $m_s=0$ level. Thus, as the microwave field is swept across resonance, the fluorescence exhibits a characteristic dip at the resonance frequency with a narrow (<0.1 mT) linewidth. Since this resonance position depends linearly on the magnetic field component along the N-V symmetry axis, the resonance position provides a reading of the magnetic field.

NV sensors detect NMR in an analogous manner. When excited by a radio-frequency pulse, nuclear magnetic moments in the analyte of interest precess around an applied DC magnetic field. This rotating magnetization produces an oscillating magnetic field, which is sensed by the NV centers. In order to ensure the highest sensitivity, microwave pulse sequences can be applied in synchrony with the nuclear precession frequency. The end result is that the NV center fluorescence strength is modulated at the same nuclear precession frequencies. Transforming the fluorescence oscillations into the frequency domain reveals the NMR spectrum of the nuclei, which can be compared to established libraries to quantify molecular composition.

Figure 2A:
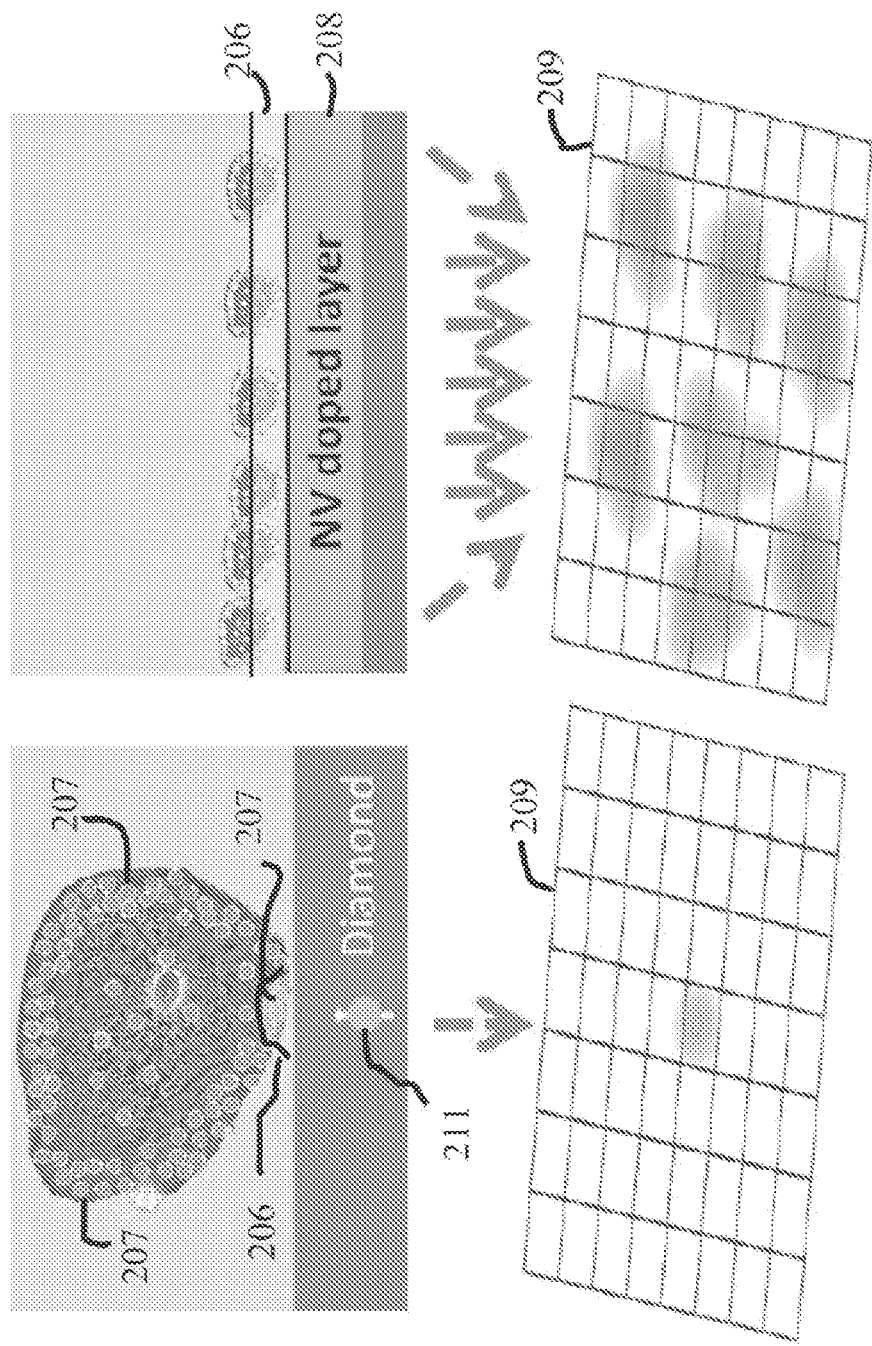
FIGS. 2A-2C illustrate example parallelizing of a diamond NMR readout and corresponding optical image, in accordance with various embodiments.
Figure 2B:
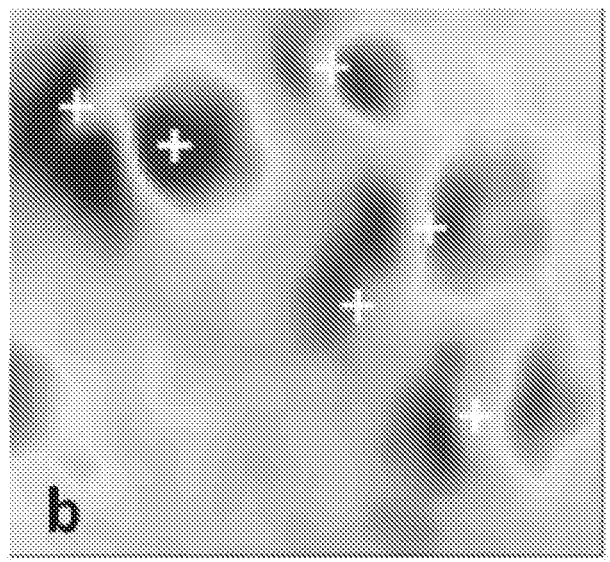
Figure 2C:
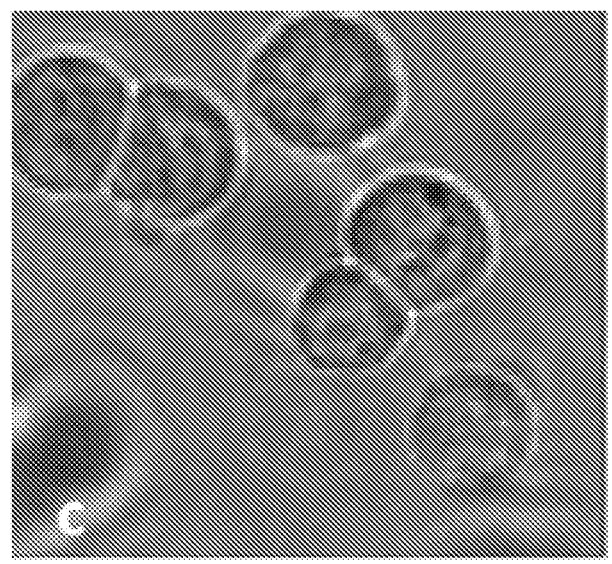

There are a number of groups working in the field of diamond NMR, and many of them are devoted to using single NV centers to detect NMR of individual molecules. Recent proof-of-principle experiments have managed to detect the NMR spectrum of an individual protein and electron paramagnetic resonance of protein containing spin labels. Of interest herein is parallelizing the readout for higher sensitivity. FIGS. 2A-2C illustrate example parallelizing of a diamond NMR readout and corresponding optical image. FIG. 2A illustrates that a readout through a single NV center can detect a few molecules at a time, requiring long signal averaging. Consider that a single NV center 211 has just a few nm sensing volume 206 within a region having a number of target molecules 207 as shown in FIG. 2A. Thus, it can only detect NMR from a few molecules at a time, which can take hours and even days of averaging to acquire a spectrum. Imaging the fluorescence from a high-density NV layer 208 enables simultaneous detection of numerous molecules with a resolution fundamentally limited by optical diffraction, which is less than 1 μm, over typical microscope fields of view of approximately 100 μm.

In various embodiments, a diamond layer 208 can be uniformly doped with many NV centers and then image their fluorescence onto a camera 209 as depicted in FIG. 2A. Many molecules can be detected simultaneously in this way, ensuring higher sensitivity. In cases where metabolites in solution are of interest (with or without cells), the diamond surface can be nanostructured to support dense, high aspect ratio gratings which enable monitoring even greater quantities of analyte by enhancing the sensor-sample contact area. See, for example, FIG. 3C. FIG. 2B illustrates a diamond magnetic microscope image of immuno-magnetically labeled cells, while FIG. 2C illustrates a corresponding optical image. A microscope as disclosed herein, can register similar images, except the registered images can report NMR contrast to record chemical composition noninvasively.

Recently performed NMR spectroscopy of picoliter-volume solutions with a nanostructured diamond chip demonstrated nearly two orders of magnitude improvement in concentration sensitivity over previous NV and picoliter NMR studies. Dense, high-aspect-ratio nanogratings in a diamond chip were fabricated using interferometric lithography and plasma etching. Then, the nanograting sidewalls were doped with an optimized density of NV color centers. The result was the sensor surface area enhanced by a factor of greater than fifteen and the NV fluorescence intensity increased by a factor of 20-50 without sacrificing the NV spin properties. This leads to a corresponding boost in NMR signal, which allows detection of approximately $4 \times 10^{12}$ spins in an approximate 1 pL detection volume with a signal-to-noise ratio of three in one second integration time.

Figure 3B:
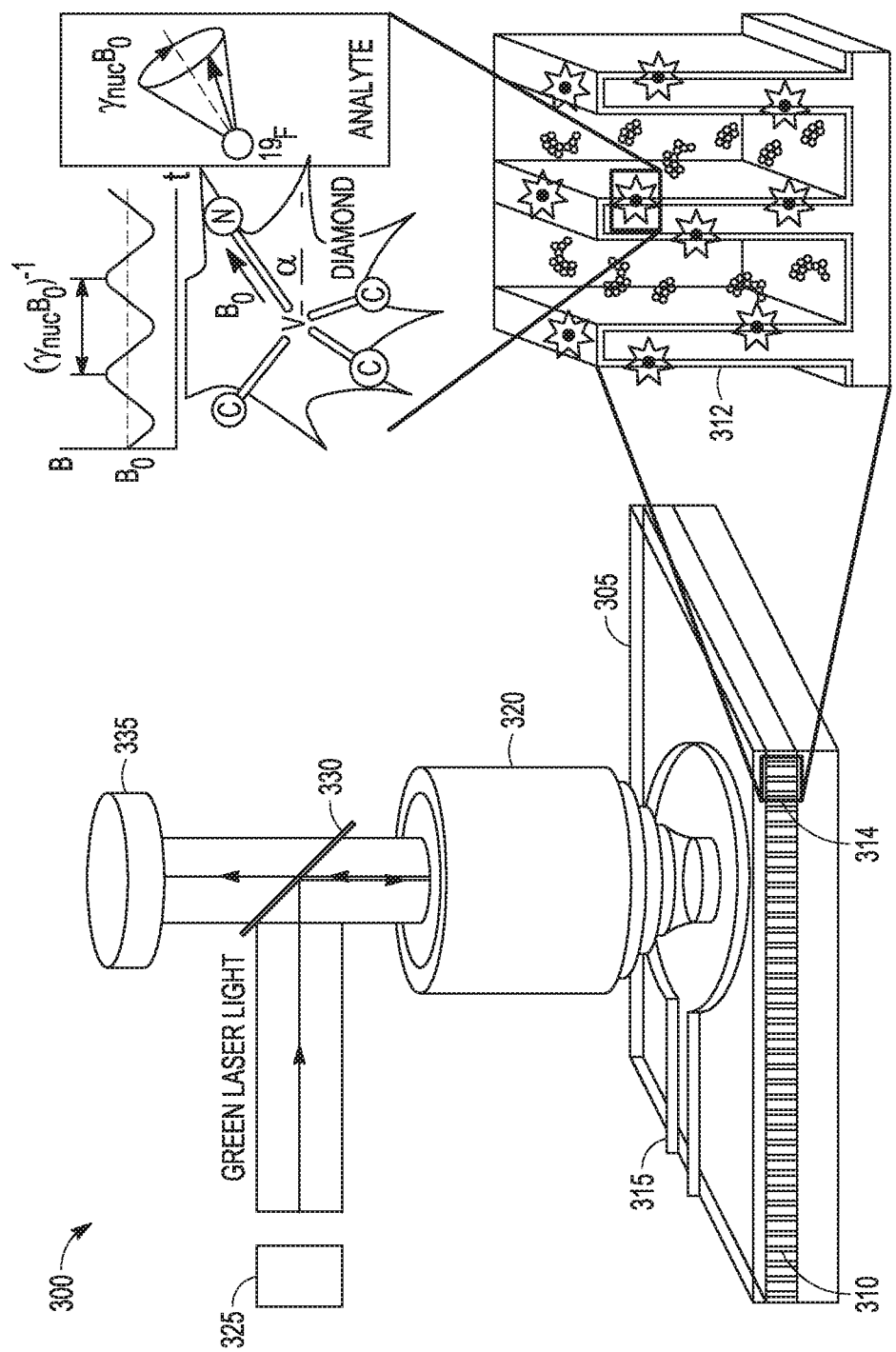
FIGS. 3B-3F show elements of an optical NMR sensor and an example NMR spectrum, in accordance with various embodiments.

FIGS. 3A-3F illustrates features associate with example picoliter NMR. FIG. 3A summarizes existing NMR techniques for small sample volumes, which provides an overview of ambient temperature NMR techniques for small volumes. Points represent experimental values for minimum detectable nuclear-spin concentration in 1 s with SNR=3. Stars represent current and proposed performance. FIGS. 3B-3F show elements of an embodiment of an optical NMR sensor and an example NMR spectrum. FIG. 3B is an illustration of an embodiment of an example epifluorescence diamond NMR setup 300. The sensor region comprises dense, high aspect ratio diamond nanogratings 310 fabricated via interferometric lithography and doped with NV centers. Diamond NMR setup 300 can include diamond nanogratings 310 embedded in a cover slip 305 with a microwave loop 315 disposed on or above cover slip 315. Diamond NMR setup 300 can include a dichroic mirror 330 to receive laser light, where dichroic mirror 330 reflects the laser light to a microscope objective 320 that directs the laser light to a region being investigated. The investigated region is a region on a platform having diamond nanogratings 310 embedded with cover slip 305. The laser light can be generated as green laser light. The diamond NMR setup 300 can include a laser source 325 that provides the laser light. A response from the region is directed back through microscope objective 320 to dichroic mirror 330 from which the response light propagates to a photodetector 335. The response light can be fluorescence in the range of 640 nm to 800 nm.

FIG. 3B also shows a volume 314 of diamond nanogratings 310 embedded in cover slip 305. The expanded view of volume 314 shows NV doped layers 312 on sidewalls of diamond nanogratings 310. FIG. 3B also shows an experimental geometry in which the analyte's precessing nuclear statistical polarization produces an oscillating magnetic field, which is sensed by adjacent near-surface NV centers as shown in the expanded view of region 314.

Figure 5:
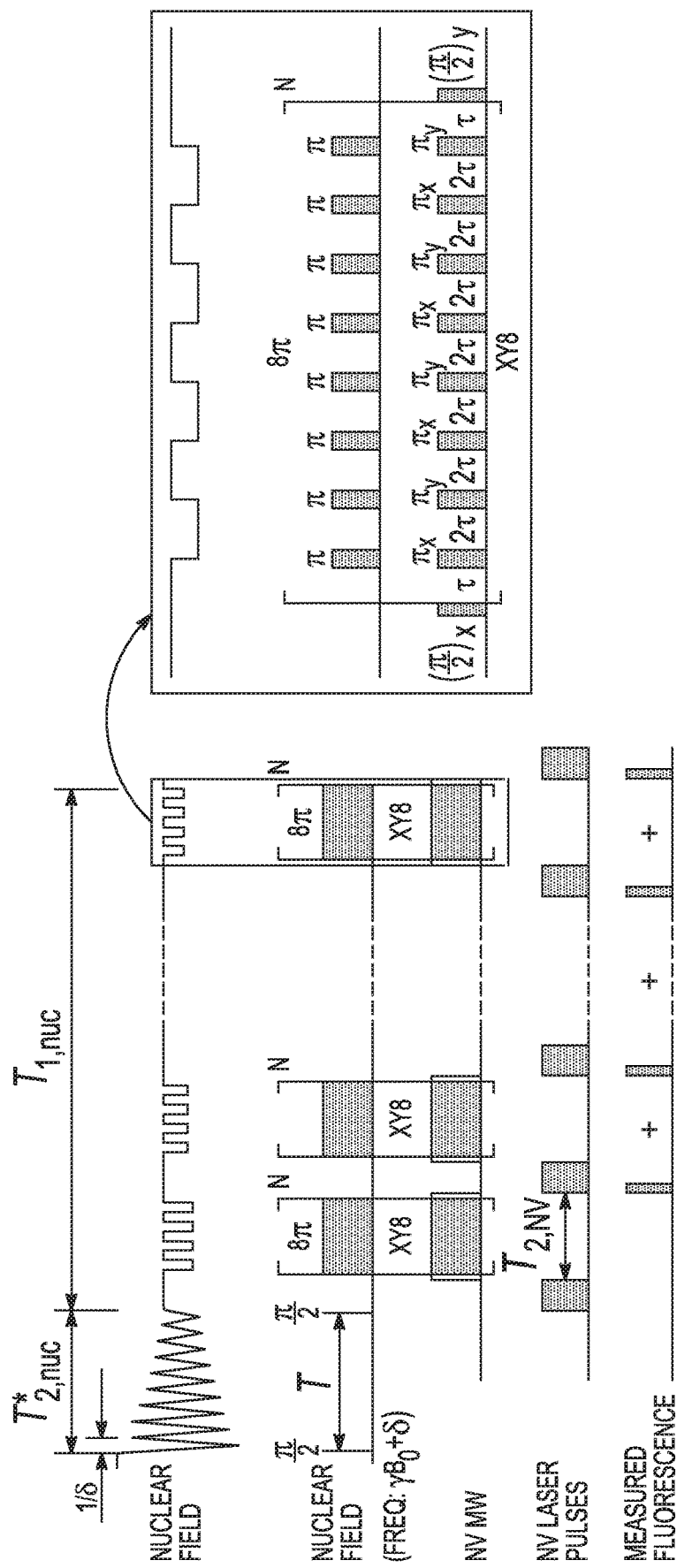
FIG. 5 illustrates a quantum sensing sequence suitable for NMR spectroscopy, in accordance with various embodiments.

In various embodiments, photodetectors can be arranged with an imaging device for nuclear magnetic resonance microscope or an imaging device may be integrated with photodetectors as part of nuclear magnetic resonance microscope. An imaging device can be implemented in diamond NMR setup 300 to image the fluorescence from diamond nanogratings 310 onto an image sensor of the imaging device. The diamond NMR setup 300, structured with an imaging device to image to image the fluorescence from the diamond film with nitrogen vacancy color centers, is a departure from a normal epifluorescence microscope which images fluorescence from the sample onto an image sensor. By recording many of these images from according to a pulse sequence such as that of FIG. 5, a hyperspectral image can be recorded, where every spatial pixel contains the NMR spectrum of the portion of the sample adjacent to that region of the diamond. These images can have, in principle, sub-micron spatial resolution, down to the optical diffraction limit (~300 nm).

Figure 3C:
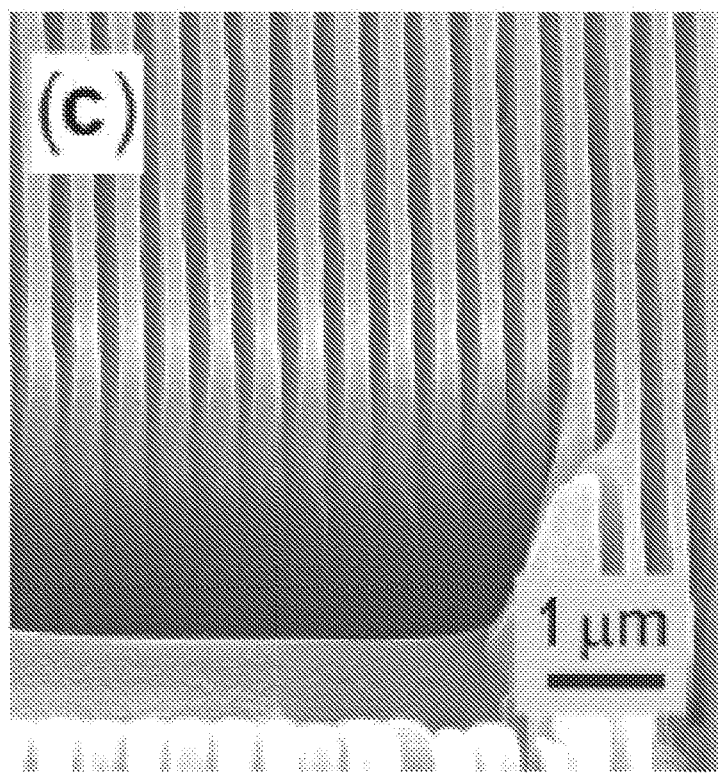
Figure 3D:
Figure 3E:
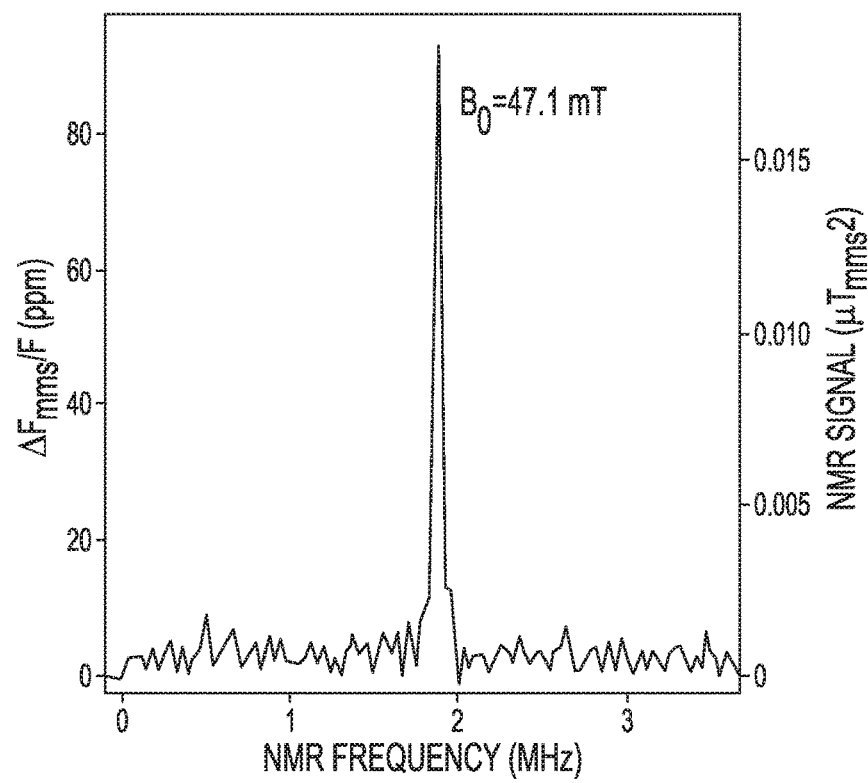
Figure 3F:
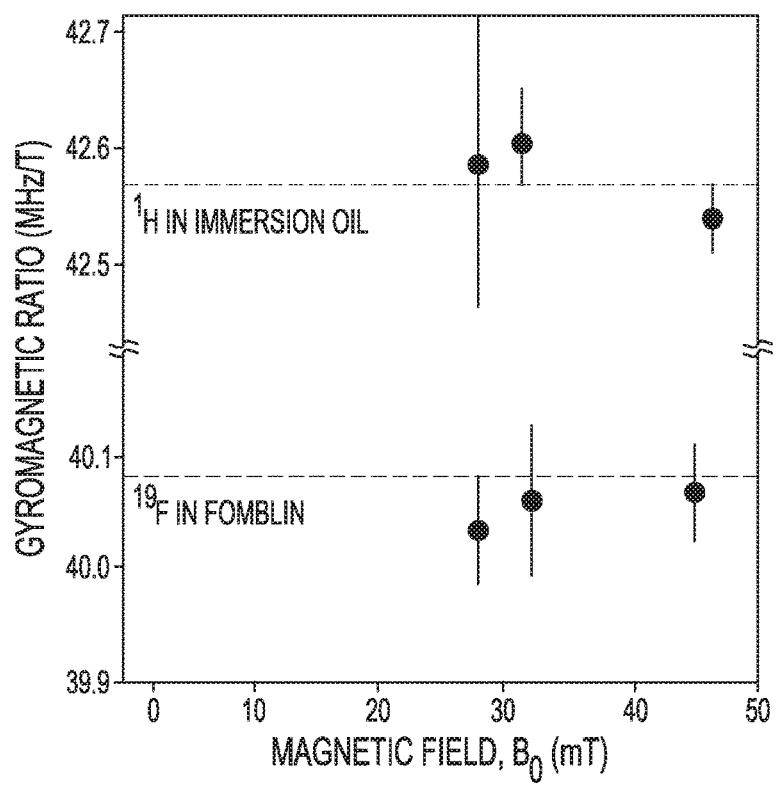

FIG. 3C show a scanning electron micrograph of a 400-nm pitch diamond nanograting. FIG. 3D illustrates an example benchtop optical NMR setup. FIG. 3E shows a NMR spectrum of $^{19}F$ nuclei in an approximate 1 pL of Fomblin® oil. FIG. 3F shows measured $^1H$ and $^{19}F$ gyromagnetic ratios, where dashed lines are literature values.

With further improvements in spectral resolution, the platform of such an optical NMR sensor can enable a wide variety of applications in biochemistry, where NMR's utility is currently limited by the amount of available analyte. Beyond the implementation of a single-cell NMR microscope, applications can include pharmacodynamic studies of metabolites and natural products, impurity profiling and quality control of pharmaceuticals, and high-throughput screening for drug discovery. These applications can benefit from the ease of microfluidic integration provided by the diamond chip platform, which would permit parallel measurements.

The following discussion relates to improving spectral resolution to <10 Hz, ~1 ppm. Having demonstrated the potential for high-sensitivity analyte detection, it is now sought to establish a high degree of chemical specificity. This may include improving the spectral resolution to better than 10 Hz. In the current discussion, the resolution is limited by diffusion of analyte across the nm-scale detection volume of each NV center, which leads to broadening of the NMR lines. This is an unfortunate side effect of using statistical polarization for detection. The statistical polarization dramatically improves for NV centers close to the surface, and the resulting signal strength scales as $d_{NV}^3$, where $d_{NV}$ is the depth of the NV center. On the other hand, the effective detection volume, and corresponding diffusion time, decreases dramatically with NV depth, and the resulting NMR linewidths scale as $d_{NV}^{-2}$. One option to address this would be to use deeper NV centers, and try to make up for the deficit in sensitivity through optimized NV doping. This is a risk-mitigating backup plan that would still address the small-college market's needs. However, the inventors have identified a new detection modality that does not feature such a steep tradeoff, which is developed herein. This detection modality is based on detection of the net nuclear polarization. As will be shown below, his detection modality offers greater than four orders of magnitude higher spectral resolution, while at the same time featuring the potential for superior sensitivity to early results.

With respect to field stabilization, before measuring narrow NMR linewidths, one may first ensure that the NMR transition frequencies of nuclei in the detection volume are sufficiently homogenous. NMR transition frequencies are generally proportional to the magnetic field, $B_0$, and chemical-structure-identifying shifts are typically on the order of one part per million (ppm) of the central NMR transition frequency. Thus, resolving chemical shifts may include stabilizing $B_0$ over the detection volume, and throughout the measurement duration, to better than 1 ppm. In traditional NMR instruments, this is a heroic (but critical) task, involving expensive magnets and elaborate engineering. Lower prices can be offered in part because stabilizing the magnetic field over a microscopic detection volume, as taught herein, is much easier.

Figure 4A:
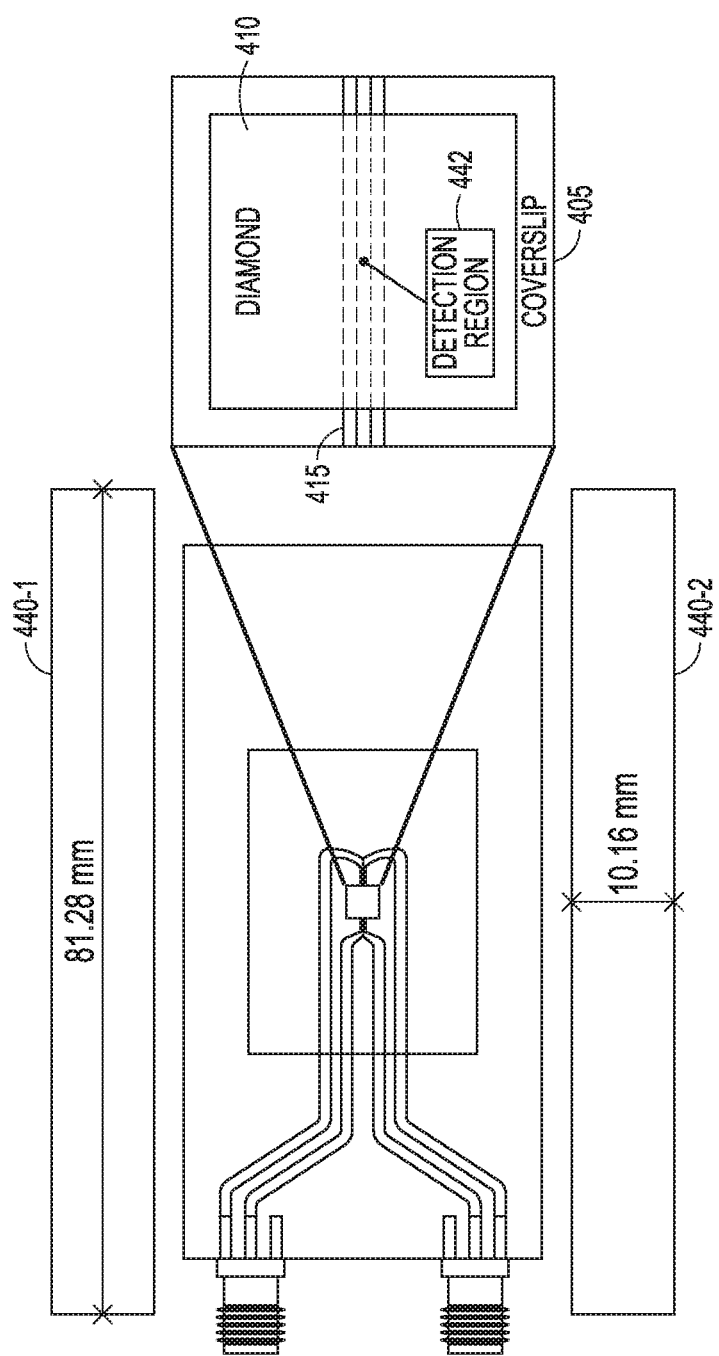
FIG. 4A illustrates an example relatively inexpensive magnet design for field stabilization, in accordance with various embodiments.

FIG. 4A shows the geometry and arrangement of magnets which can stabilize the field for a fraction of the cost of ordinary benchtop NMR instruments. The magnets are modeled from commercially-available permanent magnets (for example from K&J Magnetics) that have cost less than $100 total. They produce a magnetic field of approximately 0.12 T over a target detection volume of interest, which is roughly 30×30×15 um$^3$ (13 pL). FIG. 4A is an illustration of microfluidic chip with integrated diamond sensor 410 embedded in coverslip 405 and microwave (RF) striplines 415 for NV (nuclear) spin control. Two permanent magnets 440-1 and 440-2, having dimensions of 81.28 mm diameter and 10.16 mm thick, are located a distance +/−20.32 mm from either side of the sensing volume with detection region 442.

Figure 4B:
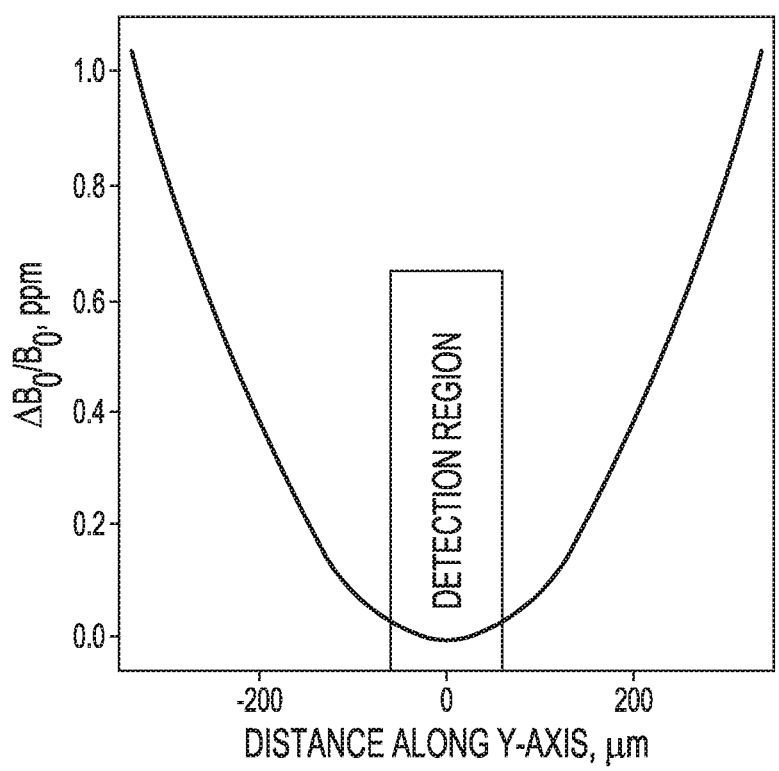
FIGS. 4B-4C are plots of magnetic field variation as a function of distance from the target center of the detection volume, in accordance with various embodiments.
Figure 4C:
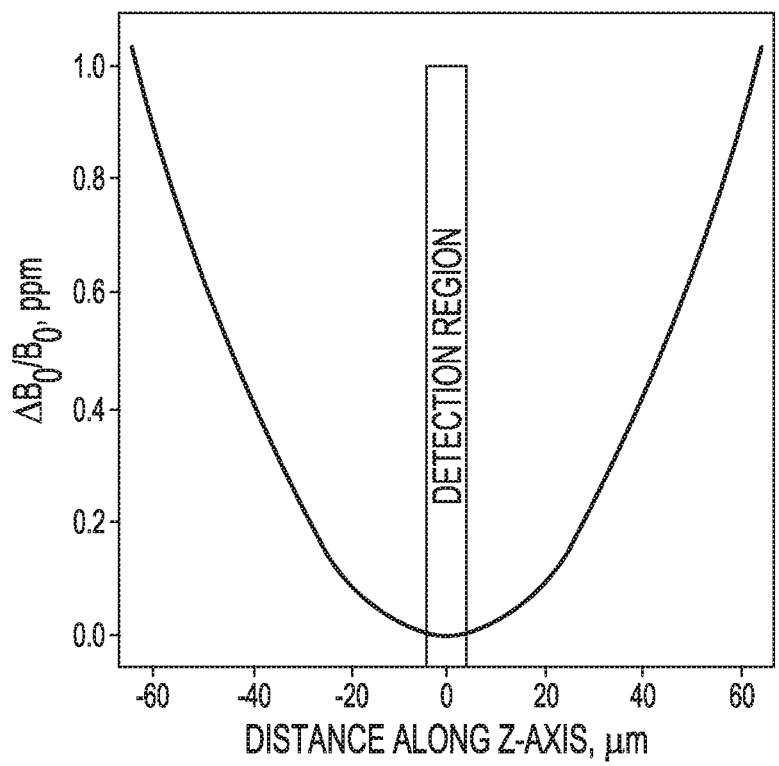

In FIGS. 4B and 4C, the magnetic field variation is plotted as a function of distance from the target center of the detection volume. The field varies by less than one ppm over regions much larger than the detection volume. This means the setup will be tolerant to modest misalignments. The magnetic field distribution are produced by the permanent magnets 440-1 and 440-2. The magnetic field in the sensing volume is 0.12 T for both FIG. 4B and FIG. 4C, showing relative magnetic field deviation as a function of lateral and axial position. The deviations are less than one ppm over regions much larger than the target detection volume (~100× 100×15 um$^3$), indicating significant tolerance to misalignment.

Consider calculation of thermal polarization signal strength. Having established that field homogeneity is unlikely to be a problem, the signal strength in the new detection modality can be estimated. Consider a thin NV sensing layer located near the diamond surface. On top of the diamond surface lies an infinite reservoir of nuclear spins with gyromagnetic ratio $\gamma_{nuc}$ and spin density $\varrho$. In the dense protons limit, $\varrho \gg d_{NV}^{-3}$, the NV center sees a uniform magnetization due to the net nuclear thermal polarization. For NMR at practical field, $h\gamma_{nuc} B_0 \ll k_B T$, where $B_0$ is the bias field, $k_B=1.38\times10^{-23}$ J/K is the Boltzmann constant, and T is the temperature, the field seen by the NV due to thermal polarization is:

$$B_{thermal} = \frac{\mu_0 \hbar^2}{16 k_B} \frac{\gamma_{nuc}^2 B_0 \rho}{T}, \quad (1)$$

where $\mu_0=4\pi\times10^{-7}$ T$^2$m$^3$/J is the vacuum permittivity and $h=1.055\times10^{-34}$ J s is the Planck constant. This equation still holds for finite analyte volumes (the situation in various arrangements disclosed herein), provided that the analyte layer is comparable in thickness to the NV sensing layer. For thinner analyte layers $B_{thermal}$ falls off as $d_{NV}^3$, but the microfluidic geometry ensures this regime is not possible. For room-temperature protons ($\gamma_{nuc}=2\pi\times42.58$ MHz/T) in water ($\varrho=6.6\times10^{25}$ spins/L) in a $B_0=0.12$ T magnetic field, Eq. (1) evaluates to $B_{thermal}=120$ pT. For a solution with $10^{12}$ spins in a 13 pL volume, the field would be $B_{thermal}=1.2$ pT. A solution containing 1 mM of spins would produce a field $B_{thermal}=0.01$ pT.

Consider diamond sensor sensitivity. In various embodiments, a new quantum sensing sequence is used that is suitable for NMR spectroscopy at magnetic fields greater than one1 Tesla. This sequence can be used with a nuclear magnetic resonance microscope disclosed herein. This sequence can allow for the use of arbitrarily high magnetic fields in the nuclear magnetic resonance measurements. The high magnetic fields are appropriate for measurement dealing with chemical specificity. This quantum sensing sequence is based on a Ramsey-type pulse sequence that samples nuclear precession and converts the final nuclear phase into longitudinal magnetization. This longitudinal magnetization can be detected using sensitive electron-nuclear double resonance (ENDOR) sequences tailored for NV centers. The pulse sequence, called Ramsey-ENDOR, is illustrated in detail in FIG. 5.

In such a Ramsey-ENDOR sequence for high-field NMR, following a $\pi/2$ pulse and free precession interval (time T), the transverse nuclear magnetization phase is converted to longitudinal magnetization via a second $\pi/2$ pulse. The longitudinal magnetization is then detected by ENDOR; it is converted to an AC magnetic field (via a train of $\pi$ pulses) that is synchronously detected via XY8 pulses sequences on NV centers. The nuclear free precession (and corresponding NMR spectrum) is obtained by repeating this sequence as a function of T and taking a Fourier Transform. Other methods of detection of longitudinal magnetization, such as double-quantum NV Ramsey sequences, may be substituted for ENDOR if appropriate.

Figure 6A:
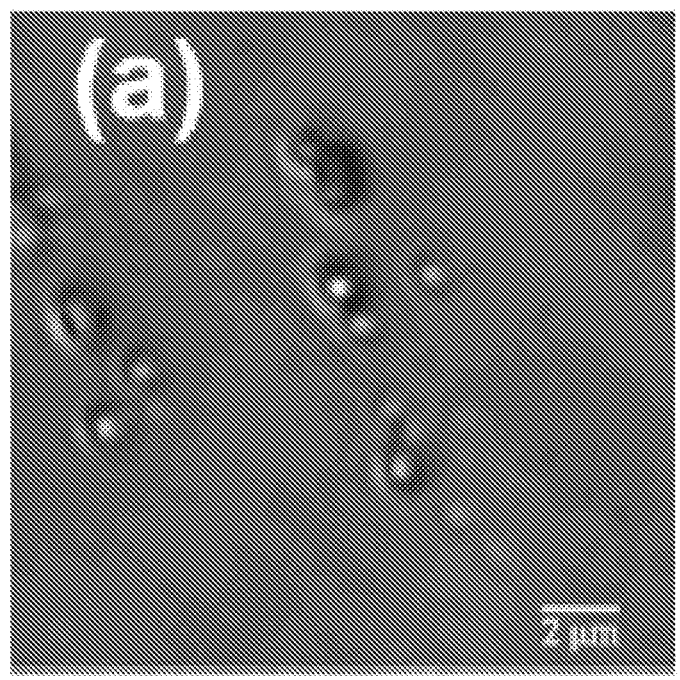
FIGS. 6A-6D illustrate example preliminary data on bias field imaging, in accordance with various embodiments.
Figure 6B:
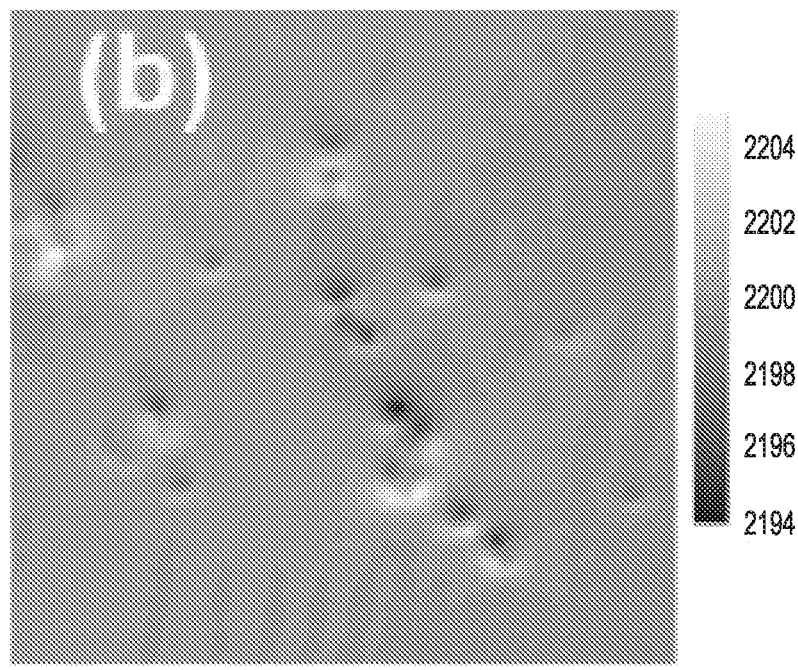
Figure 6C:
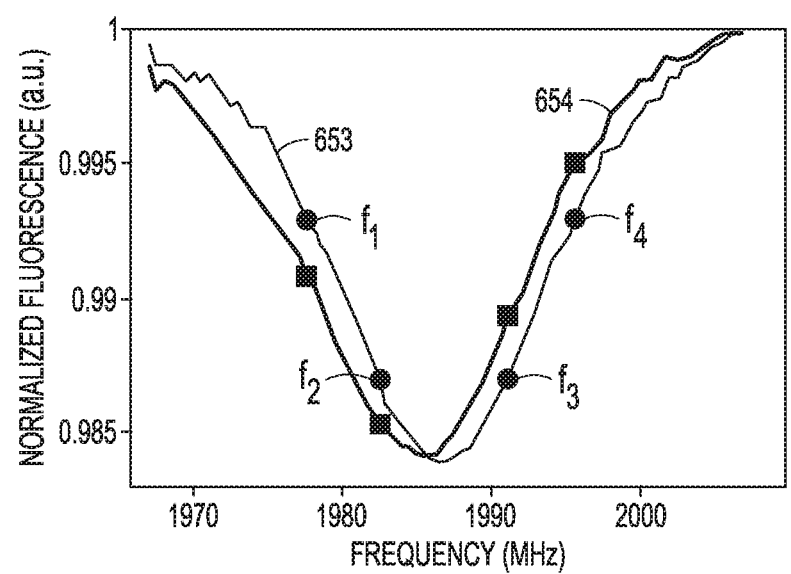
Figure 6D:
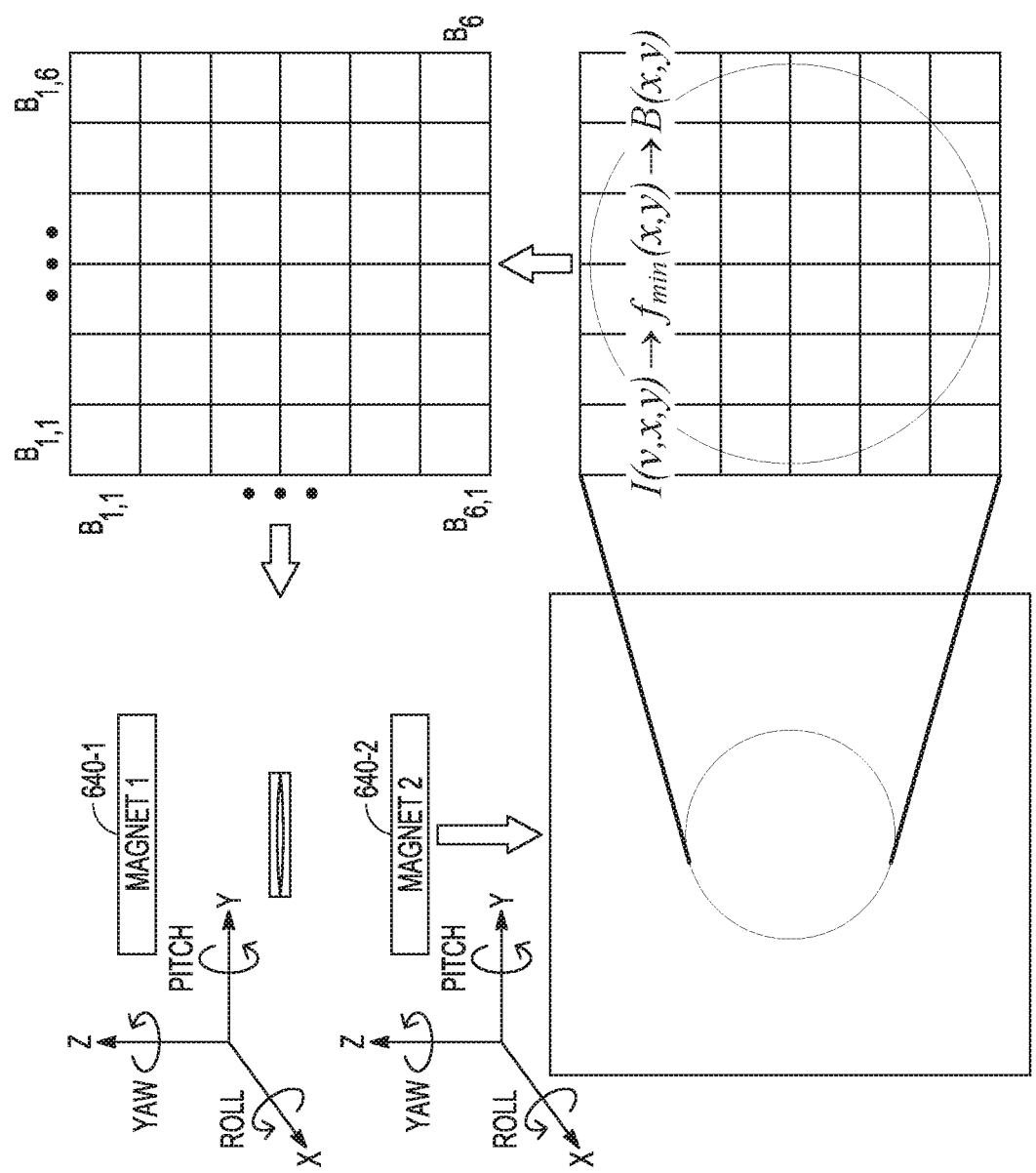

In order to align the diamond sensor to the sweet spot of the magnets, a novel diamond imaging procedure can be used to image the magnetic field gradients. FIGS. 6A-6D illustrate example preliminary data on bias field imaging. FIG. 6A is a white light optical image of superparamagnetic beads deposited on a diamond chip. FIG. 6B is a magnetic image of the same beads at B=24 mT. The field was large enough to orient the magnetic field from the beads but not enough to achieve complete polarization. FIG. 6C shows ODMR signals 653 and 654 at two different locations on a diamond chip. Images taken at each of four microwave frequencies $f_1$, $f_2$, $f_3$, and $f_4$ are used to create the magnetic images. FIG. 6D represents a feedback loop for minimizing the magnetic field gradients. A CMOS camera can capture the frequency dependent fluorescences and retrieves the per pixel bin magnetic field values. The alignment of both or either of the magnets 640-1 and 640-2 is adjusted. This process is repeated until a field distribution corresponding to a local minima is obtained.

As is demonstrated in FIGS. 6C-6D, at the minimum gradient point there is a local minimum in the magnetic flux intensity. In an embodiment, an example tuning procedure can involve using the same NV centers that will be used for NMR detection to image the local magnetic field distribution. An example of optical and magnetic images of magnetic beads are shown in FIGS. 6A-6B. By employing software pixel binning to dramatically shorten the averaging times, a rapid feedback loop can be implemented to fine-tune the alignment of the permanent magnets 640-1 and 640-2 to assure that the local field minimum coincides with sensing volume, as indicated in FIG. 6D. A magnetic field profile may be obtained with the "four-point method." Initially a full reference ODMR spectrum averaged over the whole sensing area is obtained and four frequency points (labeled $f_1$, $f_2$, $f_3$, and $f_4$) are chosen symmetrically with regards to the resonance frequency. Then, four sets of images can be taken while applying a microwave field at each of the four different frequencies. Then the quantity $$\frac{(f2 - f1) - (f3 - f4)}{f1 + f2 + f3 + f4}$$

is plotted for each pixel bin. As can be seen in FIG. 6C, a shift in resonance frequency leads to a change in the aforementioned quantity and yields a qualitative picture of the magnetic field distribution without the need to sweep the whole frequency range.

Consider improving sensitivity to $<10^{10}$ spins in 1 pL and <10 mM. The example platform discussed above exhibits record sensitivity. Nonetheless, there is significant room for improvement. The sensitivity demonstrated was still about two orders of magnitude worse than the theoretical sensitivity plotted in FIG. 3A. The largest contributions to this discrepancy are: NV control pulse errors, which reduce the contrast by approximately 5 times from the ideal case, imperfect doping parameters, which reduce $N_{NV}$ by up to 5× and increase $d_{NV}$ by up to 2× from the ideal case, and an approximate 2.5× lower signal strength for nanograting samples due to degradation of the mask used to block ions from penetrating the nanograting tops. These three factors account for ~28 times difference in sensitivity between theory and experiment. One risk-mitigating strategy is to address these factors in using the same statistical polarization detection modality as used previously. However, in order to have the biggest impact, it is preferred to improve the sensitivity while simultaneously featuring the realized sub-10 Hz spectral resolution.

According to Eq. (1), a solution with $10^{12}$ spins in a 13 pL volume produces a field $B_{thermal}$=2 pT, while a 1 mM solution produces an even smaller field, $B_{thermal}$=0.01 pT. Considering the sensitivity of the sensor designed in FIG. 4A is $B_{min}$=20 pT, detection of the former may be possible with several minutes of averaging, but detection of the latter would take prohibitively long. To address this, one can turn to methods of DNP.

DNP is already commonly employed in commercial NMR instrumentation, but it is elaborate, including quasi-THz microwave control, rapid sample shuttling, low temperatures, and high vacuum. Depicted in FIG. 8A, the primary challenge in DNP is to transfer the thermal polarization of electrons, which is larger than that of nuclei by a factor of approximately 1000, to the target nuclear spin species. Typically, electron spins must be introduced into the sample and polarization is only efficiently transferred at cryogenic temperatures. These conventional DNP strategies may not be compatible with the benchtop NMR market.

Fortunately, the diamond platform, taught herein, appears to be a near ideal alternative to these techniques. NV electron spins can be nearly perfectly polarized at room temperature and moderate fields simply by shining green light on them. In addition to NV centers, there are other electron spins in the diamond sensor that can be used as a resource, including electron spins associated with nitrogen atoms internal to the crystal (P1 centers) and dangling bonds on the surface (surface spins). All of these spin species feature remarkably long spin lifetimes (0.1-1 ms) at room temperature. This removes the need to cryogenically cool to transfer polarization.

Figure 7A:
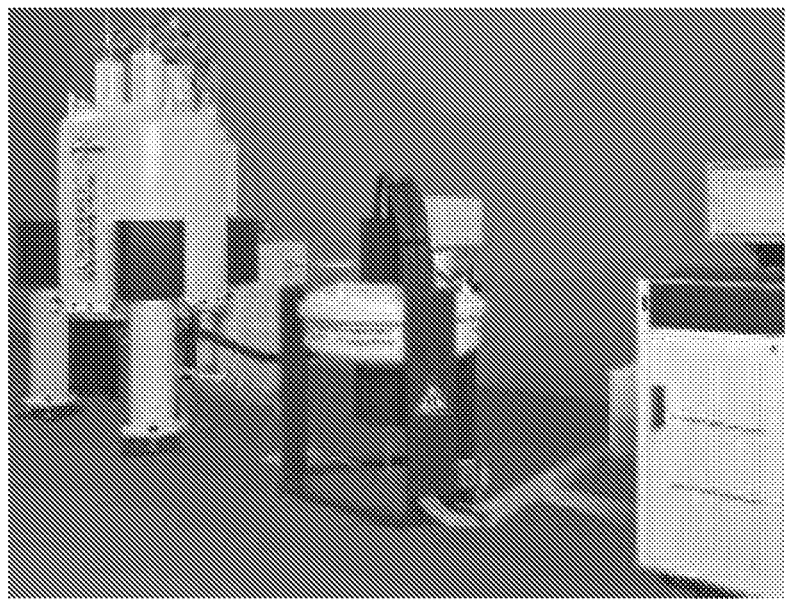
FIGS. 7A-7C illustrate instruments and features associated with example dynamic nuclear polarization, in accordance with various embodiments.
Figure 7B:
Figure 7C:
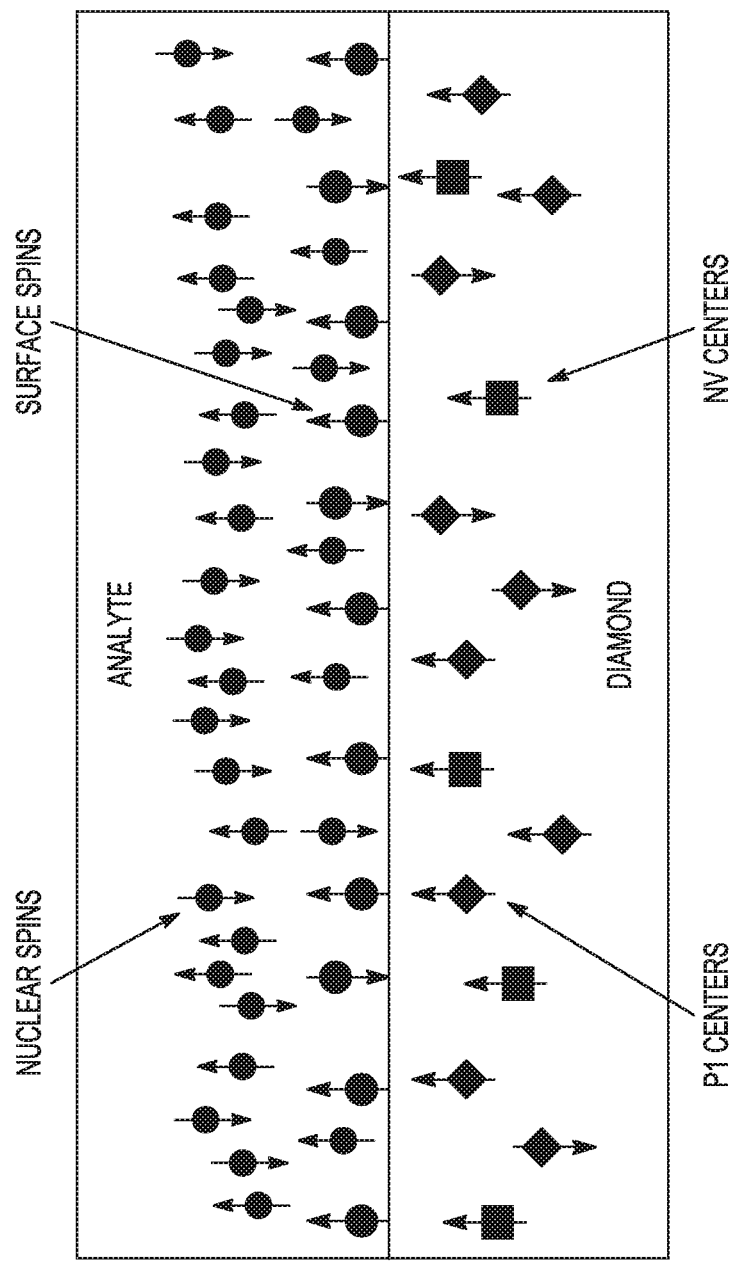

FIGS. 7A-7C illustrate instruments and features associate with example dynamic nuclear polarization. FIG. 7A depicts a commercial DNP system sold for greater than $1M by Bruker. FIG. 7B is an example NV-based system that operates at room temperature in a portable form factor. FIG. 7C shows a representation, aside from analyte nuclear spins, of three spin species. The three spin species are NV electron spins, internal nitrogen electron spins (P1), and surface electron spins that are present inside the diamond sensor 710 and can be used to polarize the nuclei beyond the thermal polarization. FIG. 7C illustrates the rich spin environment intrinsic to various embodiments of sensors taught herein.

Figure 8B:
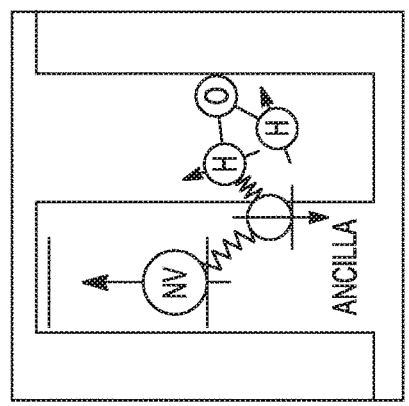
FIGS. 8A-8B illustrate example polarization transfer strategies, in accordance with various embodiments.
Figure 8A:
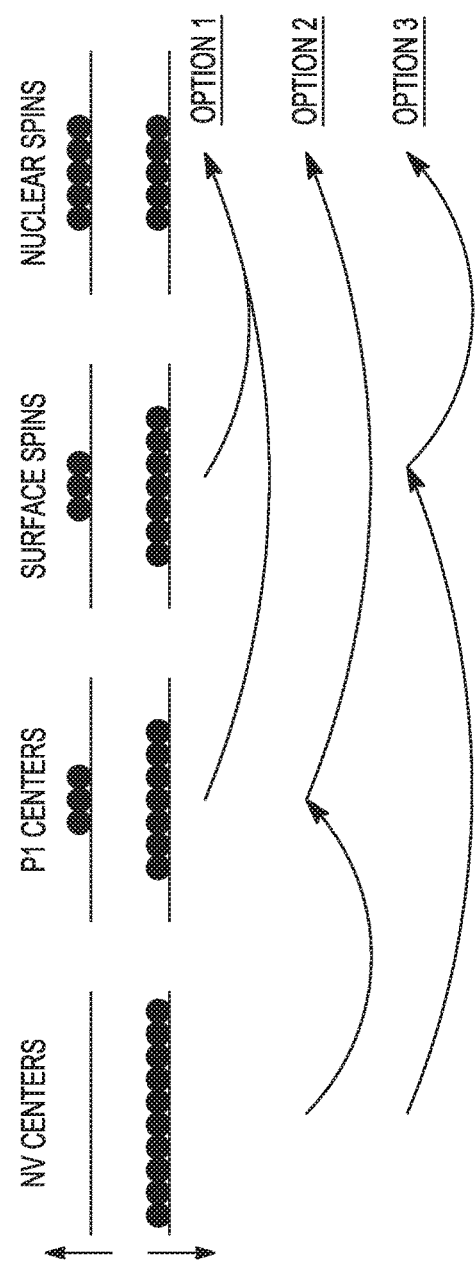

FIGS. 8A-8B illustrate example polarization transfer strategies. FIG. 8A is an illustration of relative polarization of each spin species and three options for DNP. FIG. 8B is an illustration of Options 2 and 3. NV centers are optically polarized, and this polarization is transferred to an ancillary internal spin system via resonant (level anticrossing) or induced (Hartmann-Hahn) cross relaxation. Transfer of the ancillae polarization to nuclear spins is accomplished by driving weakly-allowed double-flip transitions (solid effect).

Several schemes for DNP are identified in FIG. 8A. In Option 1, the NV centers are not used. In this option, the fact that electron spin polarization is approximately 1000× larger than nuclear spin polarization is exploited. The polarization can be transferred by driving the composite spin system at a frequency equal to the sum of the two individual Larmor frequencies. The transfer is made possible due to the hyperfine coupling between electron spins and, which is especially useful if heating due to intense microwaves is a problem, will be to use a resonant Hartmann-Hahn protocol. Option 1 has the advantage of involving the least amount of hardware and using the already well-established techniques of electron-nuclear polarization transfer. The downside is that the maximum polarization enhancement is 1000×. In principle this is just enough enhancement to reach the 1 mM sensitivity level. The nuclear field would be increased by 1000× to the 10 pT level (Eq. 1). This is comparable to the sensor sensitivity, $B_{min}$=20 pT. However, in practice, enhancements in the 10-100 range are more likely due to competition between slow transfer rate and spin relaxation. See Table 1. To realize sub-mM concentration sensitivity, the near-unity NV spin polarization can be employed.

Table 1 provides information with respect to diamond spin coupling. Spin flip (polarization transfer) rates are compared to relation rates. A critical spin-spin distance may be inferred and compared to the typical distance present in current devices.

TABLE 1

| Species | Spin flip rate | Relaxation rate | Critical distance, spin flip > relaxation | Typical distance |
|---|---|---|---|---|
| $^{13}C$ internal | $\gamma_{13C}\gamma_{nuc}/r^3$ | $1/T_{1,13C} \approx$ 0.01 kHz | r < 1 nm | $Q^{-3}_{13C} \approx$ 0.8 nm |
| NV direct | $\gamma_{NV}\gamma_{nuc}/r^3$ | $1/T_{1,NV} \approx$ 1 kHz | r < 3 nm | $d_{NV} \approx$ 5 nm |
| P1 | $\gamma_{P1}\gamma_{nuc}/r^3$ | $1/T_{1,P1} \approx$ 2 kHz | r < 2.4 nm | $d_{P1} \approx$ 2 nm |
| Surf spins | $\gamma_{SS}\gamma_{nuc}/r^3$ | $1/T_{1,SS} \approx$ 5 kHz | r < 1.8 nm | $\sigma^2_{SS} \approx$ 1-3 nm |

In Options 2 and 3 in FIG. 8A, the optical polarization of NV centers is used to polarize an ancillary spin system (either P1 centers or surface spins), and the resulting polarization is then transferred to the nuclear spin species. As before, there are several strategies for polarization transfer including solid effect, Hartmann-Hahn, resonant cross-relaxation, or some combination. The transfer rates between electron spin species are large, in the MHz range. Thus, the rate-limiting process is the transfer from ancillary electron species to analyte nuclear spins. Fortunately, these rates exceed the relevant spin relaxation rates for typical defect densities. See Table 1.

With the above DNP strategies, it is anticipated that enhancements of 3-6 orders of magnitude may be possible. Even if the enhancement is weaker than expected, another risk-mitigating path to improving sensitivity is by reducing the minimum detectable magnetic field. For this, the NV doping may be optimized to increase the number of NV centers contributing to the signal while maintaining long coherence times. A doping strategy can be used that follows closely that depicted in FIG. 4A-4B. Isotopically-pure diamond films with controlled density may be fabricated using commercial processing. The concentration of NV centers may be optimized by introducing vacancies vie implantation of He+ ions. He+ ions can be used because they have been shown to be relatively inert and do not perturb NV sensing properties. Yet, by controlling the implantation dose and energy, the layer of NV centers can be specifically controlled.

A sensitivity target may mandate a polarization enhancement of about 1000×. The most convenient path to nuclear hyperpolarization is the solid effect (See FIG. 8A, Option 1) as it does not involve sophisticated microwave phase and intensity control. A microwave field may be applied through two microwave striplines, which can be similar to the configuration of striplines 415 shown in FIG. 4A, where one loop drives the NV centers, and the other one drives the nucleus-electron spin-flips. One of the concerns with the solid effect approach is the heat generated by applying high power continuous wave (CW) microwave pulses; however, this can be combated to some extent by using a larger analyte reservoir or adjusting the duty cycle of the polarizing microwave pulses. In the case that the hyperpolarization achievable by solid-effect is insufficient either due to heating issues or to a slow polarization transfer rate, a double-resonance protocol may be employed (See FIG. 8A, Options 2,3). The double-resonance protocol may be employed by first transferring the NV polarization to either surface spins or P1 centers, which act as intermediaries between the analyte spins and NV centers. The NV-electron transfer includes driving both of the species at the same Rabi frequency, while the electron-nucleus transfer is achievable by matching the Rabi frequency of the former to match the Larmor frequency of the latter.

Figure 9:
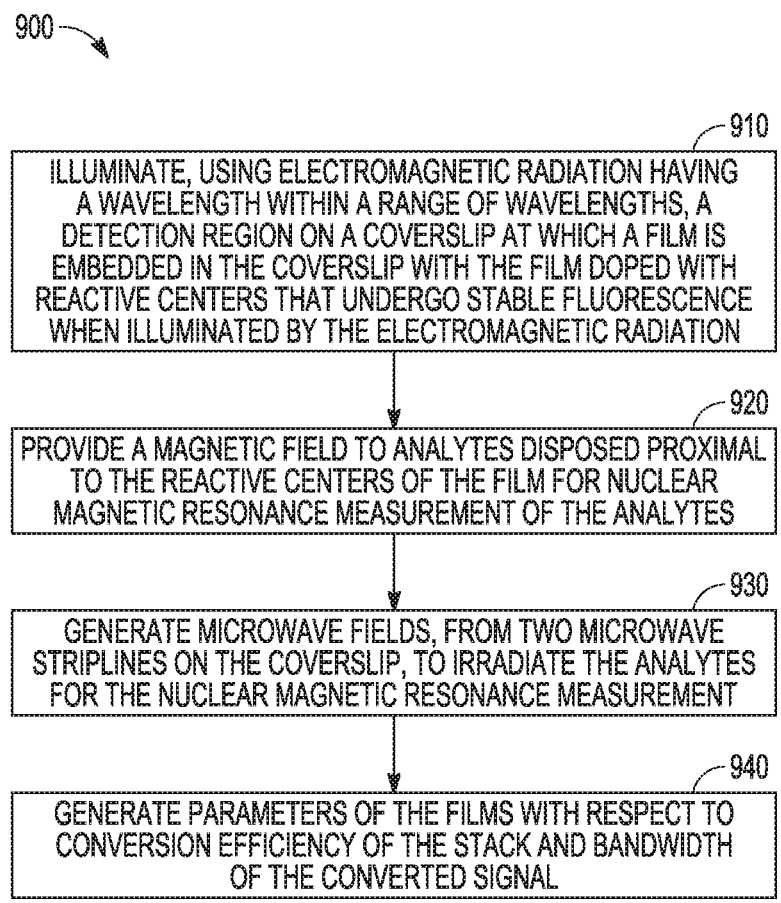
FIG. 9 is a flow diagram of features of an example measurement protocol for a nuclear magnetic resonance measurement, in accordance with various embodiments.

FIG. 9 is a flow diagram of features of an embodiment of an example measurement protocol 900 for a nuclear magnetic resonance measurement. Measurement protocol 900 or similar measurement protocols can include one or more techniques to perform dynamic nuclear polarization. At 910, a detection region is illuminated using electromagnetic radiation having a wavelength within a range of wavelengths. The detection region is on a coverslip at which a film is embedded in the coverslip with the film doped with reactive centers that undergo stable fluorescence when illuminated by the electromagnetic radiation. The term reactive centers refers to materials that react to illumination by electromagnetic radiation such as by undergoing fluorescence. The film can be a magneto-fluorescent diamond film with the reactive centers being nitrogen vacancy color centers. The magneto-fluorescent diamond film can include a diamond nanograting having sidewalls with the sidewalls doped with the nitrogen vacancy color centers. The illuminating using electromagnetic radiation can include illuminating using a laser that generates green laser light. See for example, FIG. 3B.

At 920, a magnetic field is provided to analytes disposed proximal to the reactive centers of the film for nuclear magnetic resonance measurement of the analytes. At 930, microwave fields are generated, from two microwave striplines on the coverslip, to irradiate the analytes for the nuclear magnetic resonance measurement. See for example, FIG. 4A. In the nuclear magnetic resonance measurement, a sensing sequence can be used that samples nuclear precession and converts final nuclear phase into longitudinal magnetization with the longitudinal magnetization detected using electron-nuclear double resonance sequences tailored for the reactive centers. The reactive centers can be nitrogen vacancy color centers. Generating microwave fields from the two microwave striplines can include generating the microwave fields at frequencies to excite the analytes proximal to the reactive centers of the film, to facilitate polarization transfer via solid effect, Hartmann-Hahn protocol, resonant cross-relaxation, or a combination thereof in the nuclear magnetic resonance measurement.

At 940, fluorescence of the reactive centers, illuminated by the electromagnetic radiation, is detected at a photodetector in response to resonance of the analytes in the nuclear magnetic resonance measurement. See for example, FIG. 3B. The photodetector can be part of a camera or other imaging device. The analytes can be imaged from detecting the fluorescence of the reactive centers.

Variations of measurement protocol 900 or methods similar to measurement protocol 900 can include performing label-free nuclear magnetic resonance imaging at sub-cellular length scales with single organelle resolution. Variations can include NMR imaging of the metabolic composition of individual cells. Variations can include monitoring adenosine triphosphate (ATP) production in mitochondria. Variations can include monitoring of evolution of pyruvate-lactate conversion in cancer cells. Variations can include monitoring diffusion of fluids through cell membranes. Variations can include monitoring dynamics of metabolites within cell cultures. Monitoring dynamics can include monitoring transport of small molecules from cell to cell. Monitoring dynamics can include metabolic profiling of bodily fluids including one or more of saliva, urine, and blood. Variations can include NMR imaging of microwell arrays or arrays of microfluidic channels for high throughput chemical analysis.

Variations of measurement protocol 900 or methods similar to measurement protocol 900 can include a measurement protocol comprising: illuminating, using electromagnetic radiation having a wavelength within a range of wavelengths, a detection region on a coverslip at which a film is embedded in the coverslip with the film doped with reactive centers that undergo stable fluorescence when illuminated by the electromagnetic radiation; providing a magnetic field to analytes disposed proximal to the reactive centers of the film for nuclear magnetic resonance measurement of the analytes; generating electromagnetic fields to irradiate the analytes for the nuclear magnetic resonance measurement; and, in the nuclear magnetic resonance measurement, using a sensing sequence that samples nuclear precession and converts final nuclear phase into longitudinal magnetization with the longitudinal magnetization detected using electron-nuclear double resonance sequences tailored for the reactive centers; and imaging the analytes from detecting fluorescence of the reactive centers, at a photodetector, in response to resonance of the analytes in the nuclear magnetic resonance measurement with the reactive centers illuminated by the electromagnetic radiation.

A system can comprise a nuclear magnetic resonance microscope arranged as a component to perform any one of the methods associated with measurement protocol 900, methods similar to measurement protocol 900, or variations thereof.

Measurement protocol 900 can operate at room temperature. Further, variations of measurement protocol 900 or methods similar to measurement protocol 900 can include a number of different embodiments that may be combined depending on the application of such measurement protocols and/or the architecture of systems in which such measurement protocols are implemented. Such measurement protocols may be performed using one or more processing devices that execute instructions stored in a memory storage device that can cause performance of operations to control instruments such as a nuclear magnetic resonance microscope, as taught herein, to perform nuclear magnetic resonance measurements.

In various embodiments, a nuclear magnetic resonance microscope can comprise: a coverslip; a film embedded in the coverslip, the film doped with reactive centers that undergo stable fluorescence when illuminated by electromagnetic radiation having a wavelength within a range of wavelengths; a magnetic field generator to provide a magnetic field for nuclear magnetic resonance measurement of analytes when disposed proximal to the film; two microwave striplines on the coverslip, the two microwave striplines arranged to generate microwave fields to irradiate the analytes for the nuclear magnetic resonance measurement; and a photodetector to detect fluorescence of the reactive centers, illuminated by the electromagnetic radiation, in response to resonance of the analytes. The nuclear magnetic resonance microscope can include a laser to illuminate the reactive centers. The two microwave striplines can be utilized to generate microwave fields at frequencies to excite the analytes proximal to the reactive centers of the film, to facilitate polarization transfer via solid effect, Hartmann-Hahn protocol, resonant cross-relaxation, or a combination thereof to provide a dynamic nuclear polarization in the nuclear magnetic resonance measurement.

Variations of such nuclear magnetic resonance microscope systems or similar systems can include a number of different embodiments that may be combined depending on the application of such systems and/or the architecture in which such systems are implemented. In such nuclear magnetic resonance microscope systems, the film can be a magneto-fluorescent diamond film. The magneto-fluorescent diamond film can include diamond doped with a layer of fluorescent sensors at a surface of the magneto-fluorescent diamond film. In various embodiments, the film can be structured with a nanograting having sidewalls with the sidewalls doped with the reactive centers. The nanograting can be structured having a diamond nanograting with the reactive centers being nitrogen vacancy color centers.

Variations of such nuclear magnetic resonance microscope systems or similar systems can include use of reactive centers that undergo stable fluorescence in a range of about 650 nm to about 800 nm when illuminated by light. Such nuclear magnetic resonance microscope systems or similar systems can include the magnetic field generator having two magnets arranged to place the coverslip between the two magnets. Variations of such nuclear magnetic resonance microscope systems or similar systems can include components of optical microscopes such as microscope objectives, and other optical components such as a dichroic mirror. See, for example, FIG. 3B.

In various embodiments, a nuclear magnetic resonance microscope can comprise: a coverslip; a magneto-fluorescent diamond film embedded in the coverslip, the magneto-fluorescent diamond film including diamond doped with a layer of fluorescent sensors at a surface of the magneto-fluorescent diamond film, with each sensor being a nitrogen vacancy color center that exhibits photostable fluorescence when illuminated; a magnetic field generator to provide a bias magnetic field for nuclear magnetic resonance measurement of analytes when disposed proximal to the magneto-fluorescent film; two microwave striplines on the coverslip, the two microwave striplines arranged to generate microwave fields to irradiate the analytes for the nuclear magnetic resonance measurement; and a photodetector to detect fluorescence of the nitrogen vacancy color centers, when illuminated, in response to resonance of the analytes in the nuclear magnetic resonance measurement. The nuclear magnetic resonance microscope can include a laser to illuminate the nitrogen vacancy color centers. The laser can generate green laser light.

Variations of such nuclear magnetic resonance microscope systems or similar systems can include a number of different embodiments that may be combined depending on the application of such systems and/or the architecture in which such systems are implemented. In such nuclear magnetic resonance microscope systems, the magneto-fluorescent diamond film can be structured with a diamond nanograting. The diamond nanograting can have sidewalls with the sidewalls doped with the nitrogen vacancy color centers.

Variations of such nuclear magnetic resonance microscope systems or similar systems can include the two microwave striplines being operable to excite the analytes proximal to the nitrogen vacancy color centers to facilitate polarization transfer via solid effect, Hartmann-Hahn protocol, resonant cross-relaxation, or a combination thereof. Such nuclear magnetic resonance microscope systems or similar systems can include a switch for activating and deactivating the nuclear magnetic resonance measurement. Such nuclear magnetic resonance microscope systems or similar systems can include a memory to record an optical image of the analytes along with nuclear magnetic resonance spectra from the analytes. Variations of such nuclear magnetic resonance microscope systems or similar systems can include components of optical microscopes such as microscope objectives, and other optical components such as a dichroic mirror. See, for example, FIG. 3B.

Figure 10:
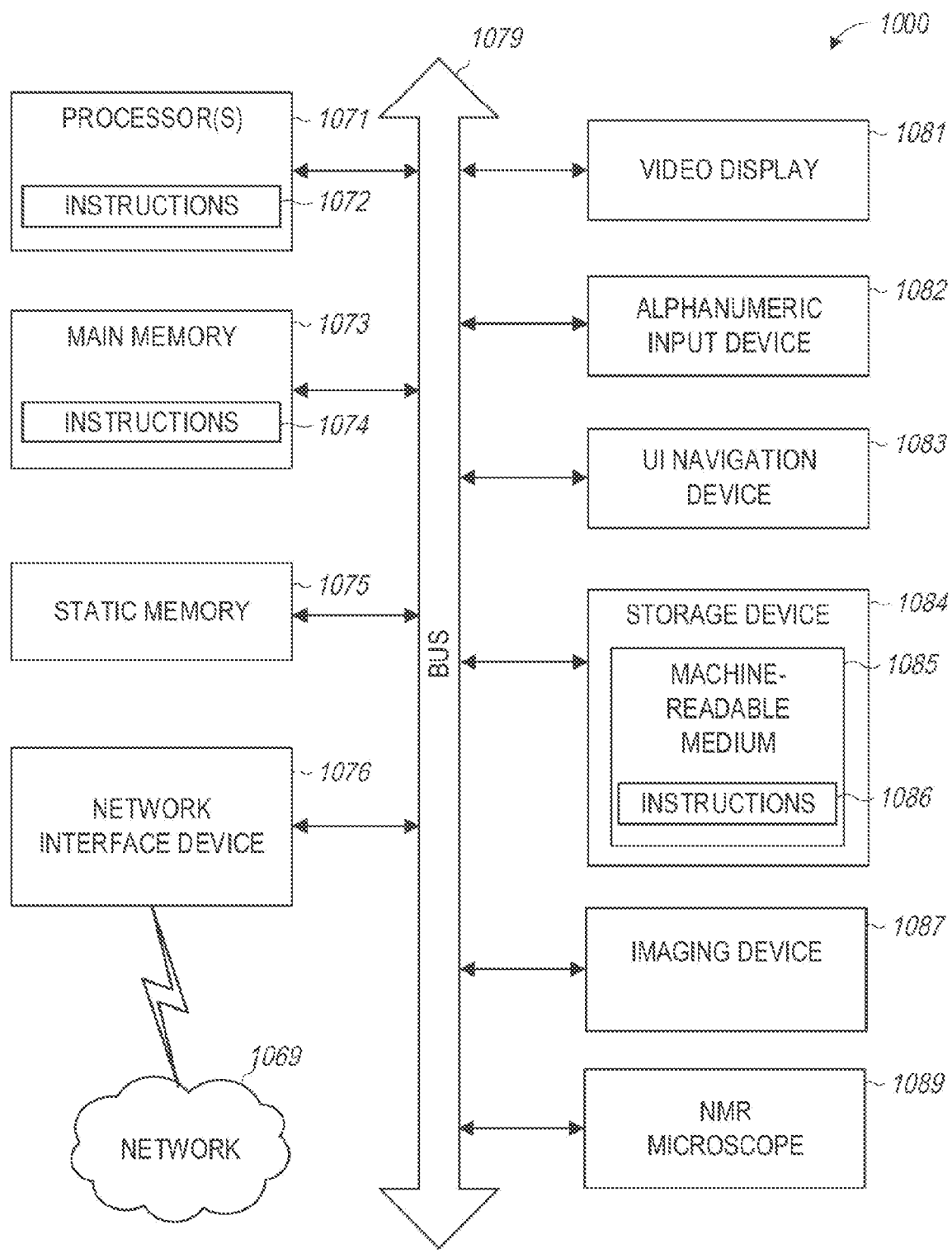
FIG. 10 is a block diagram illustrating features of an embodiment of an example system having a nuclear magnetic resonance microscope, in accordance with various embodiments.

FIG. 10 is a block diagram illustrating features of an embodiment of an example system 1000 having a nuclear magnetic resonance microscope 1089 to perform any one of the methodologies discussed herein. Nuclear magnetic resonance microscope 1089 can be realized in accordance with nuclear magnetic resonance microscopes disclosed herein or combinations of components of such nuclear magnetic resonance microscopes. System 1000 represents one or more machines associated with a nuclear magnetic resonance microscope and architectures, as taught herein. System 1000 may be a machine that operates as a standalone device or may be networked to other machines. In a networked deployment, the system 1000 may operate in the capacity of either a server or a client machine in server-client network environments, or it may act as a peer machine in peer-to-peer (or distributed) network environments. Further, while system 1000 is shown only as a single machine, the term "system" shall also be taken to include any collection of machines that individually or jointly execute a set (or multiple sets) of instructions to perform any one or more of the methodologies discussed herein.

System 1000 can include one or more processors 1071, a main memory 1073 and a static memory 1077, which communicate with each other via a link 1079, for example a bus. System 1000 may further include a video display unit 1081, an alphanumeric input device 1082 (for example, a keyboard), and a user interface (UI) navigation device 1083 (for example, a mouse). Video display unit 1081, alphanumeric input device 1082, and UI navigation device 1083 may be incorporated into a touch screen display. A UI of system 1000 can be realized by a set of instructions that can be executed by processor 1071 to control operation of video display unit 1081, alphanumeric input device 1082, and UI navigation device 1083. The UI can control real-time operation of nuclear magnetic resonance microscope 1089 embedded in instructions in components of system 1000.

System 1000 may additionally include a storage device 1084, an imaging device 1087, a network interface device 1076, and one or more sensors (not shown), such as a global positioning system (GPS) sensor, compass, accelerometer, or other sensor. The communications may be provided using link 1079 in a wired transmission or a wireless transmission. Imaging device 1087 can be arranged with photodetectors for nuclear magnetic resonance microscope 1089 or may be integrated with photodetectors as part of nuclear magnetic resonance microscope 1089. Imaging device 1087 can be implemented in system 1000 to image the fluorescence from a film onto an image sensor of the imaging device 1087. The film embedded in a coverslip for operation of nuclear magnetic resonance microscope 1089, where the film is doped with reactive centers that undergo stable fluorescence when illuminated by electromagnetic radiation. The film can be a magneto-fluorescent diamond film embedded in the coverslip, where the magneto-fluorescent diamond film includes diamond doped with nitrogen vacancy color centers. The film can be structured as disclosed herein. The nuclear magnetic resonance microscope 1089 structured with imaging device 1087 to image to image the fluorescence from the film, such as a diamond film with nitrogen vacancy color centers, is a departure from a normal epifluorescence microscope which images fluorescence from the sample onto a image sensor. By recording many of these images from according to the pulse sequence of FIG. 5, a hyperspectral image can be recorded, where every spatial pixel contains the NMR spectrum of the portion of the sample adjacent to that region of the diamond. These images can have, in principle, sub-micron spatial resolution, down to the optical diffraction limit (~300 nm).

Storage device 1084 can include a machine-readable medium 1085 on which is stored one or more sets of data structures and instructions 1086 (for example, software) embodying or utilized by any one or more of the methodologies or functions to operate with respect to nuclear magnetic resonance described herein. Storage device 1084 can include instructions to operate as a switch for activating and deactivating the nuclear magnetic resonance measurement conducted using nuclear magnetic resonance microscope 1089. Storage device 1084 can include memory to record an optical image of the analytes along with nuclear magnetic resonance spectra from the analytes. The instructions 1086 to operate nuclear magnetic resonance microscope 1089 may also reside, completely or at least partially, within the main memory 1073, static memory 1075, and/or within the processors 1071 during execution thereof by system 1000, with main memory 1073, static memory 1075, and processors 1071 also constituting machine-readable media. Control components for operating a nuclear magnetic resonance microscope and associated architecture, as taught herein, can be distributed as modules having instructions in one or more of the machine-readable medium 1085, main memory 1073, static memory 1075, and/or within the processors 1071 during execution thereof by system 1000.

While the machine-readable medium 1085 is illustrated in an example embodiment to be a single medium, the term "machine-readable medium" may include a single medium or multiple media (e.g., a centralized or distributed database, and/or associated caches and servers) that store the one or more instructions 1086. The term "machine-readable medium" shall also be taken to include any tangible medium that is capable of storing instructions for execution by the machine and that cause the machine to control any one or more of the methodologies taught herein or that is capable of storing data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 1086 may further be transmitted or received over a communications network 1069 using a transmission medium via the network interface device 1076 utilizing any one of a number of well-known transfer protocols (e.g., HTTP). In addition, communications network 1069 may operably include a communication channel propagating results obtained using nuclear magnetic resonance microscope 1089. Examples of communication networks include a local area network (LAN), a wide area network (WAN), the Internet, mobile telephone networks, plain old telephone (POTS) networks, and wireless data networks (e.g., Wi-Fi, 3G, and 4G LTE/LTE-A or WiMAX networks). The term "transmission medium" shall be taken to include any medium that is capable of carrying messages or instructions for execution by a machine, and includes any medium that is capable of propagating digital or analog communications signals.

While various embodiments have been disclosed herein, other aspects and embodiments will be apparent to those skilled in the art. Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A nuclear magnetic resonance microscope comprising:
a coverslip;
a film embedded in the coverslip, the film doped with reactive centers that undergo stable fluorescence;
a magnetic field generator to provide a magnetic field for nuclear magnetic resonance measurement of analytes disposed proximal to the film;
two microwave striplines on the coverslip, the two microwave striplines arranged to generate microwave fields to irradiate the analytes for the nuclear magnetic resonance measurement; and
a photodetector to detect fluorescence of the reactive centers, illuminated by the electromagnetic radiation, in response to resonance of the analytes.

2. The nuclear magnetic resonance microscope of claim 1, wherein the nuclear magnetic resonance microscope includes a laser to illuminate the reactive centers.

3. The nuclear magnetic resonance microscope of claim 1, wherein the film is a magneto-fluorescent diamond film.

4. The nuclear magnetic resonance microscope of claim 3, wherein the magneto-fluorescent diamond film includes diamond doped with a layer of fluorescent sensors at a surface of the magneto-fluorescent diamond film.

5. The nuclear magnetic resonance microscope of claim 1; wherein the film is structured with a nanograting having sidewalk with the sidewalls doped with the reactive centers.

6. The nuclear magnetic resonance microscope of claim 5, wherein the nanograting is structured having a diamond nanograting with the reactive centers being nitrogen vacancy color centers.

7. The nuclear magnetic resonance microscope of claim 1, wherein the reactive centers undergo stable fluorescence in a range of about 650 nm to about 800 nm.

8. The nuclear magnetic resonance microscope of claim 1, wherein the magnetic field generator includes two magnets arranged to place the coverslip between the two magnets.

9. A nuclear magnetic resonance microscope comprising:
a coverslip;
a magneto-fluorescent diamond film embedded in the coverslip, the magneto-fluorescent diamond film including diamond doped with a layer of fluorescent sensors at a surface of the diamond film, with each sensor being a nitrogen vacancy color center that exhibits photostable fluorescence;
a magnetic field generator to provide a bias magnetic field for nuclear magnetic resonance measurement of analytes disposed proximal to the magneto-fluorescent film;
two microwave striplines on the coverslip, the two microwave striplines arranged to generate microwave fields to irradiate the analytes for the nuclear magnetic resonance measurement; and
a photodetector to detect fluorescence of the nitrogen vacancy color centers in response to resonance of the analytes in the nuclear magnetic resonance measurement.

10. The nuclear magnetic resonance microscope of claim 9, wherein the nuclear magnetic resonance microscope includes a laser to illuminate the nitrogen vacancy color centers.

11. The nuclear magnetic resonance microscope of claim 10, wherein the laser generates green laser light.

12. The nuclear magnetic resonance microscope of claim 9, wherein the magneto-fluorescent diamond film is structured with a diamond nanograting.

13. The nuclear magnetic resonance microscope of claim 12, wherein the diamond nanograting has sidewalls with the sidewalls doped with the nitrogen vacancy color centers.

14. The nuclear magnetic resonance microscope of claim 9, wherein the two microwave striplines are operable to excite the analytes proximal to the nitrogen vacancy color centers to facilitate polarization transfer via solid effect; Hartmann-Hahn protocol; resonant cross-relaxation, or a combination thereof.

15. The nuclear magnetic resonance microscope of claim 9, wherein the nuclear magnetic resonance microscope includes a switch for activating and deactivating the nuclear magnetic resonance measurement.

16. The nuclear magnetic resonance microscope of claim 9; wherein the nuclear magnetic resonance microscope includes a memory to record an optical image of the analytes along with nuclear magnetic resonance spectra from the analytes.

17. A measurement method comprising:
illuminating, using electromagnetic radiation having a wavelength within a range of wavelengths, a detection region on a coverslip at which a film is embedded in the coverslip with the film doped with reactive centers that undergo stable fluorescence;
providing a magnetic field to analytes disposed proximal to the reactive centers of the film for nuclear magnetic resonance measurement of the analytes;
generating microwave fields, from two microwave striplines on the coverslip, to irradiate the analytes for the nuclear magnetic resonance measurement; and
detecting fluorescence of the reactive centers, at a photodetector, in response to resonance of the analytes in the nuclear magnetic resonance measurement with the reactive centers illuminated by the electromagnetic radiation.

18. The measurement method of claim 17, wherein the method includes imaging analytes from detecting the fluorescence of the reactive centers.

19. The measurement method of claim 17, wherein the method includes, in the nuclear magnetic resonance measurement, using a sensing sequence that samples nuclear precession and converts final nuclear phase into longitudinal magnetization with the longitudinal magnetization detected using electron-nuclear double resonance sequences tailored for the reactive centers.

20. The measurement method of claim 19, wherein the reactive centers are nitrogen vacancy color centers.

21. The measurement method of claim 17, wherein the film is a magneto-fluorescent diamond film with the reactive centers being nitrogen vacancy color centers.

22. The measurement method of claim 21, wherein the magneto-fluorescent diamond film includes a diamond nanograting having sidewalls with the sidewalls doped with the nitrogen vacancy color centers.

23. The measurement method of claim 17, wherein illuminating using electromagnetic radiation includes illuminating using a laser that generates green laser light.

24. The measurement method of claim 17, wherein generating microwave fields from two microwave striplines includes generating the microwave fields at frequencies to excite the analytes proximal to the reactive centers of the film, to facilitate polarization transfer via solid effect, Hartmann-Hahn protocol, resonant cross-relaxation, or a combination thereof in the nuclear magnetic resonance measurement.

25. The measurement method of claim 17, wherein the method includes performing label-free nuclear magnetic resonance imaging at sub-cellular length scales with single organelle resolution.

26. The measurement method of claim 17, wherein the method includes nuclear magnetic resonance imaging of metabolic compositions of individual cells.

27. The measurement method of claim 17, wherein the method includes monitoring adenosine triphosphate (ATP) production in mitochondria.

28. The measurement method of claim 17, wherein the method includes monitoring of evolution of pyruvate-lactate conversion in cancer cells.

29. The measurement method of claim 17, wherein the method includes monitoring diffusion of fluids through cell membranes.

30. The measurement method of claim 17, wherein the method includes monitoring dynamics of metabolites within cell cultures.

31. The measurement method of claim 30, wherein monitoring dynamics includes monitoring transport of small molecules from cell to cell.

32. The measurement method of claim 30, wherein monitoring dynamics includes metabolic profiling of bodily fluids including one or more of saliva, urine, and blood.

33. The measurement method of claim 17, wherein the method includes nuclear magnetic resonance imaging of microwell arrays or arrays of microfluidic channels for high throughput chemical analysis.

34. A measurement method comprising:
    illuminating, using electromagnetic radiation having a wavelength within a range of wavelengths, a detection region on a coverslip at which a film is embedded in the coverslip with the film doped with reactive centers that undergo stable fluorescence;
    providing a magnetic field to analytes disposed proximal to the reactive centers of the film for nuclear magnetic resonance measurement of the analytes;
    generating electromagnetic fields to irradiate the analytes for the nuclear magnetic resonance measurement; and
    in the nuclear magnetic resonance measurement, using a sensing sequence that samples nuclear precession and converts final nuclear phase into longitudinal magnetization with the longitudinal magnetization detected using electron-nuclear double resonance sequences tailored for the reactive centers; and
    imaging the analytes from detecting fluorescence of the reactive centers, at a photodetector, in response to resonance of the analytes in the nuclear magnetic resonance measurement with the reactive centers illuminated by the electromagnetic radiation.

\* \* \* \* \*

UNITED STATES PATENT AND TRADEMARK OFFICE
CERTIFICATE OF CORRECTION

| | |
|---|---|
| PATENT NO. | : 11,313,817 B2 |
| APPLICATION NO. | : 17/271445 |
| DATED | : April 26, 2022 |
| INVENTOR(S) | : Acosta et al. |

It is certified that error appears in the above-identified patent and that said Letters Patent is hereby corrected as shown below:

On the Title Page

In item (71), in "Applicants", in Column 1, Lines 2-3, after "(US);", delete "Victor Marcel Acosta, Albuquerque, NM (US);"

In the Claims

In Column 17, Line 26, in Claim 5, delete "claim 1;" and insert --claim 1,-- therefor In Column 17, Line 28, in Claim 5, delete "sidewalk" and insert --sidewalls-- therefor In Column 18, Line 7, in Claim 14, delete "effect;" and insert --effect,-- therefor In Column 18, Line 8, in Claim 14, delete "protocol;" and insert --protocol,-- therefor In Column 18, Lines 14-15, in Claim 16, delete "claim 9;" and insert --claim 9,-- therefor Signed and Sealed this
Eighth Day of November, 2022

*Katherine Kelly Vidal*

Katherine Kelly Vidal
*Director of the United States Patent and Trademark Office*